(12) United States Patent
King et al.

(10) Patent No.: US 9,238,309 B2
(45) Date of Patent: Jan. 19, 2016

(54) METHODS FOR FABRICATING MICROSTRUCTURES

(75) Inventors: William P. King, Champaign, IL (US); Andrew H. Cannon, Columbia, SC (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 1096 days.

(21) Appl. No.: 13/201,408

(22) PCT Filed: May 8, 2009

(86) PCT No.: PCT/US2009/043306
§ 371 (c)(1),
(2), (4) Date: Oct. 24, 2011

(87) PCT Pub. No.: WO2010/096072
PCT Pub. Date: Aug. 26, 2010

(65) Prior Publication Data
US 2012/0043693 A1    Feb. 23, 2012

Related U.S. Application Data

(60) Provisional application No. 61/153,028, filed on Feb. 17, 2009.

(51) Int. Cl.
*B29C 33/38* (2006.01)
*B29C 33/40* (2006.01)
(Continued)

(52) U.S. Cl.
CPC ......... *B29C 33/3857* (2013.01); *B29C 33/3878* (2013.01); *B29C 33/3885* (2013.01); *B29C 33/42* (2013.01); *B29C 33/424* (2013.01); *B29C 33/306* (2013.01); *B29C 33/405* (2013.01); *B29C 45/2673* (2013.01); *B29C 2033/426* (2013.01); *B29C 2043/025* (2013.01); *B29C 2059/023* (2013.01)

(58) Field of Classification Search
None
See application file for complete search history.

(56) References Cited

U.S. PATENT DOCUMENTS 3,872,682 A    3/1975  Shook
4,053,265 A *  10/1977 Wulker et al. ............. 425/20
(Continued)

FOREIGN PATENT DOCUMENTS

EP    1 820 619    8/2007
EP    1 341 655    10/2008
(Continued)

OTHER PUBLICATIONS

Notice of Preliminary Rejection dated Nov. 12, 2013, from Korean Intellectual Property Office for counterpart Korean Patent Application No. 10-2011-7021672.
(Continued)

*Primary Examiner* — Jeffrey Wollschlager
(74) *Attorney, Agent, or Firm* — Lathrop & Gage LLP

(57) ABSTRACT

Described herein are casting and molding methods useful for making microstructured objects. By including a plurality of microfeatures on the surface of an object, other characteristics may be imparted to the object, such as increased hydrophobicity. Some of the casting and molding methods described herein further allow for manufacture of objects having both microfeatures and macro features, for example microfeatures on or within macro features or selected macro feature regions.

8 Claims, 15 Drawing Sheets

(51) Int. Cl.
B29C 33/30 (2006.01)
B29C 43/02 (2006.01)
B29C 45/26 (2006.01)
B29C 33/42 (2006.01)
B29C 59/02 (2006.01)

(56) References Cited

U.S. PATENT DOCUMENTS

| | | | |
|---|---|---|---|
| 4,421,153 A | 12/1983 | Wilkinson et al. | |
| 5,055,163 A | 10/1991 | Bier et al. | |
| 5,512,131 A | 4/1996 | Kumar et al. | |
| 5,512,219 A | 4/1996 | Rowland et al. | |
| 5,681,661 A | 10/1997 | Kelly | |
| 5,735,985 A | 4/1998 | Ghosh et al. | |
| 5,983,982 A | 11/1999 | Vihtelic et al. | |
| 6,039,897 A * | 3/2000 | Lochhead et al. | 264/1.24 |
| 6,190,594 B1 | 2/2001 | Gorman et al. | |
| 6,242,163 B1 | 6/2001 | Stampfl et al. | |
| 6,280,090 B1 | 8/2001 | Stephens et al. | |
| 6,299,981 B1 | 10/2001 | Azzopardi et al. | |
| 6,375,776 B1 | 4/2002 | Buoni et al. | |
| 6,491,851 B1 * | 12/2002 | Keller et al. | 264/1.32 |
| 6,502,622 B2 | 1/2003 | Lee et al. | |
| 6,511,622 B1 | 1/2003 | Vihtelic et al. | |
| 6,660,363 B1 | 12/2003 | Barthlott | |
| 6,663,820 B2 | 12/2003 | Arias et al. | |
| 7,081,269 B2 | 7/2006 | Yang et al. | |
| 7,141,812 B2 | 11/2006 | Appleby et al. | |
| 7,144,241 B2 | 12/2006 | Hennessey et al. | |
| 7,175,723 B2 | 2/2007 | Jones et al. | |
| 7,195,872 B2 | 3/2007 | Agrawal et al. | |
| 7,198,747 B2 | 4/2007 | Yang et al. | |
| 7,237,337 B2 | 7/2007 | Yeh et al. | |
| 7,410,606 B2 | 8/2008 | Appleby et al. | |
| 7,411,204 B2 | 8/2008 | Appleby et al. | |
| 7,462,852 B2 | 12/2008 | Appleby et al. | |
| 7,478,791 B2 | 1/2009 | Takamatsu et al. | |
| 7,767,273 B2 * | 8/2010 | Huizinga et al. | 427/558 |
| 7,851,045 B2 | 12/2010 | Gandon et al. | |
| 2001/0007682 A1 | 7/2001 | Chiu et al. | |
| 2001/0032691 A1 * | 10/2001 | Ohsawa | 152/209.18 |
| 2001/0036602 A1 | 11/2001 | McGrew et al. | |
| 2002/0066978 A1 | 6/2002 | Kim et al. | |
| 2003/0075814 A1 * | 4/2003 | Keller et al. | 264/1.32 |
| 2003/0108710 A1 | 6/2003 | Coyle et al. | |
| 2003/0111150 A1 * | 6/2003 | Zimmer et al. | 152/209.19 |
| 2003/0148401 A1 | 8/2003 | Agrawal et al. | |
| 2003/0173720 A1 | 9/2003 | Musso et al. | |
| 2003/0187170 A1 | 10/2003 | Burmeister | |
| 2003/0201249 A1 * | 10/2003 | Harker et al. | 216/54 |
| 2004/0028875 A1 | 2/2004 | Van Rijn et al. | |
| 2004/0067339 A1 | 4/2004 | Gandon et al. | |
| 2004/0104507 A1 * | 6/2004 | Gmur | 264/219 |
| 2004/0187997 A1 * | 9/2004 | Paturle et al. | 152/523 |
| 2005/0067286 A1 | 3/2005 | Ahn et al. | |
| 2005/0089803 A1 | 4/2005 | Bouaidat et al. | |
| 2005/0110174 A1 * | 5/2005 | Chen | 264/1.34 |
| 2005/0140070 A1 * | 6/2005 | Finnah et al. | 264/636 |
| 2005/0148984 A1 | 7/2005 | Lindsay et al. | |
| 2005/0181195 A1 | 8/2005 | Dubrow | |
| 2005/0228491 A1 | 10/2005 | Snyder et al. | |
| 2005/0266271 A1 | 12/2005 | Tsuchiya et al. | |
| 2005/0269743 A1 | 12/2005 | Kroupenkine et al. | |
| 2005/0280182 A1 | 12/2005 | Boegli | |
| 2006/0043634 A1 | 3/2006 | Corrigan | |
| 2006/0078724 A1 | 4/2006 | Bhushan et al. | |
| 2006/0087051 A1 * | 4/2006 | Bunick et al. | 264/109 |
| 2006/0096865 A1 * | 5/2006 | Keller et al. | 205/70 |
| 2006/0097361 A1 | 5/2006 | Tanaka et al. | |
| 2006/0110537 A1 | 5/2006 | Huang et al. | |
| 2006/0122596 A1 | 6/2006 | Dubrow | |
| 2006/0162896 A1 | 7/2006 | Schmitz et al. | |
| 2006/0172168 A1 | 8/2006 | Wright et al. | |
| 2006/0201909 A1 | 9/2006 | Pan et al. | |
| 2006/0231728 A1 | 10/2006 | Takamatsu et al. | |
| 2006/0235107 A1 | 10/2006 | Takamatsu et al. | |
| 2006/0286305 A1 | 12/2006 | Thies et al. | |
| 2006/0292345 A1 | 12/2006 | Dave et al. | |
| 2007/0028588 A1 | 2/2007 | Varanasi et al. | |
| 2007/0031639 A1 | 2/2007 | Hsu et al. | |
| 2007/0049047 A1 | 3/2007 | Fujimoto et al. | |
| 2007/0160790 A1 | 7/2007 | Kaneke et al. | |
| 2007/0166513 A1 | 7/2007 | Sheng et al. | |
| 2007/0212522 A1 | 9/2007 | Heidari et al. | |
| 2007/0228619 A1 | 10/2007 | Kawaguchi et al. | |
| 2007/0231542 A1 | 10/2007 | Deng et al. | |
| 2007/0257400 A1 * | 11/2007 | Stenzel et al. | 264/293 |
| 2007/0259156 A1 | 11/2007 | Kempers et al. | |
| 2007/0264481 A1 | 11/2007 | DeSimone et al. | |
| 2007/0271791 A1 | 11/2007 | Lai et al. | |
| 2007/0292702 A1 | 12/2007 | Saumweber | |
| 2008/0029239 A1 | 2/2008 | Mau | |
| 2008/0093776 A1 | 4/2008 | Williams | |
| 2008/0176049 A1 | 7/2008 | Ro et al. | |
| 2008/0193749 A1 * | 8/2008 | Thompson et al. | 428/343 |
| 2008/0199663 A1 | 8/2008 | Burmeister | |
| 2008/0212181 A1 * | 9/2008 | Wu | 359/530 |
| 2008/0213853 A1 | 9/2008 | Garcia et al. | |
| 2008/0241512 A1 | 10/2008 | Boris et al. | |
| 2008/0248263 A1 | 10/2008 | Kobrin | |
| 2008/0251964 A1 | 10/2008 | Pricone | |
| 2008/0280106 A1 | 11/2008 | Takamatsu et al. | |
| 2008/0296252 A1 | 12/2008 | D'Urso et al. | |
| 2008/0296260 A1 | 12/2008 | Tserepi et al. | |
| 2008/0303176 A1 | 12/2008 | Peltz et al. | |
| 2009/0011222 A1 | 1/2009 | Xiu et al. | |
| 2009/0029145 A1 | 1/2009 | Thies et al. | |
| 2009/0039563 A1 | 2/2009 | Okinaka et al. | |
| 2009/0046362 A1 | 2/2009 | Guo et al. | |
| 2009/0061039 A1 | 3/2009 | Zhang et al. | |
| 2009/0072428 A1 | 3/2009 | Lizotte et al. | |
| 2010/0028604 A1 | 2/2010 | Bhushan et al. | |
| 2010/0096113 A1 | 4/2010 | Varanasi et al. | |
| 2010/0115950 A1 | 5/2010 | Haje et al. | |
| 2010/0252177 A1 | 10/2010 | Sargent et al. | |
| 2010/0308509 A1 * | 12/2010 | David et al. | 264/448 |
| 2010/0316842 A1 | 12/2010 | Tuteja et al. | |
| 2010/0319183 A1 | 12/2010 | Hulseman et al. | |
| 2011/0089604 A1 | 4/2011 | Hulseman et al. | |
| 2011/0206903 A1 | 8/2011 | Mazumder | |
| 2011/0229667 A1 | 9/2011 | Jin et al. | |
| 2011/0266724 A1 | 11/2011 | Hulseman et al. | |
| 2011/0311764 A1 | 12/2011 | Hulseman et al. | |
| 2012/0052241 A1 | 3/2012 | King et al. | |
| 2012/0126458 A1 | 5/2012 | King et al. | |
| 2012/0223451 A1 | 9/2012 | Hulseman et al. | |
| 2012/0263919 A1 * | 10/2012 | Ferguson et al. | 428/156 |
| 2013/0064990 A1 | 3/2013 | Lu et al. | |
| 2014/0000857 A1 | 1/2014 | King | |

FOREIGN PATENT DOCUMENTS

| | | |
|---|---|---|
| JP | 2005-312343 | 11/2005 |
| JP | 2005-349558 | 12/2005 |
| JP | 2007-507342 | 3/2007 |
| JP | 2007-144917 | 6/2007 |
| JP | 2008-044283 | 2/2008 |
| JP | 2008-508181 | 3/2008 |
| JP | 2009-034630 | 2/2009 |
| WO | WO 97/13633 | 4/1997 |
| WO | WO 2004/000568 | 12/2003 |
| WO | WO 2005/065619 | 7/2005 |
| WO | WO 2006/037148 | 4/2006 |
| WO | WO 2006/132640 | 12/2006 |
| WO | WO 2007/019362 | 2/2007 |
| WO | WO 2007/029845 | 3/2007 |
| WO | WO 2007/043987 | 4/2007 |
| WO | WO 2007/056338 | 5/2007 |
| WO | WO 2007/064803 | 6/2007 |
| WO | WO 2007/101174 | 9/2007 |
| WO | WO 2007/126432 | 11/2007 |
| WO | WO 2008/005208 | 1/2008 |
| WO | WO 2008/014519 | 1/2008 |
| WO | WO 2008/035917 | 3/2008 |

(56) References Cited

FOREIGN PATENT DOCUMENTS

| WO | WO 2008/036074 | 3/2008 |
| --- | --- | --- |
| WO | WO 2008/047144 | 4/2008 |
| WO | WO 2008/098030 | 8/2008 |
| WO | WO 2009/009185 | 1/2009 |
| WO | WO 2009/147858 | 12/2009 |
| WO | WO 2010/096072 | 8/2010 |
| WO | WO 2010/096073 | 8/2010 |
| WO | WO 2010/138132 | 12/2010 |
| WO | WO 2011/156670 | 12/2011 |
| WO | WO 2012/116301 | 8/2012 |
| WO | WO 2014/011372 | 1/2014 |

OTHER PUBLICATIONS

Notice of Reasons for Rejection dispatched Apr. 2, 2013, for Japanese Patent Application No. 2011-550108.
Notice of Reasons for Rejection dispatched Apr. 2, 2013, for Japanese Patent Application No. 2011-550107.
Notice of Preliminary Rejection dated Dec. 28, 2012, for Korean Patent Application No. 10-2011-7021672.
Examiner's Requisition dated Oct. 11, 2012, from the Canadian Intellectual Property Office for Canadian Patent Application No. 2,752,798.
Notice of Preliminary Rejection dated Nov. 15, 2012, for Korean Patent Application No. 10-2011-7021673.
Cannon et al. (Jan. 18, 2010) "Hydrophobicity of curved microstructured surfaces," *J. Micromech. Microeng.* 20:025018.
Dutka et al. (2011) "Mesoscopic analysis of Gibbs' criterion for sessile nanodroplets on trapezoidal substrates," PACS Nos. 68.03.Cd, 47.55.D-, 47.55.np, 68.15.+e.
Rose et al. (2004) "Surface Tension Effects and Enhancement of Condensation Heat Transfer", Chemical Engineering Research and Design, 82(A4): 419-429.
Boreyko et al. (2009), "Self-Propelled Dropwise Condensate on Superhydrophobic Surfaces" PRL 103, 184501.
Chen et al. (2007), "Dropwise condensation on superhydrophobic surfaces with two-tier roughness," Applied Physics Letters 90, 173108.
Choi et al. (2009), "A modified Cassie—Baxter relationship to explain contact angle hysteresis and anisotropy on non-wetting textured surfaces," Journal of Colloid and Interface Science 339: 208-216.
Dietz et al. (2010), "Visualization of droplet departure on a superhydrophobic surface and implications to heat transfer enhancement during dropwise condensation," Applied Physics Letters 97, 033104.
Field et al. (2006), "Pressure Drop of Two-Phase Refrigerant-Oil Mixtures in a Small Channel," International Refrigeration and Air Conditioning Conference at Purdue, Jul. 17-20, 2006, R148, pp. 1-8.
Kang et al. (2012) "Wettability of Metal Surfaces Having Pyramid and Mushroom Patterns," GSF32-022, TFEC8, Mar. 18-21, Songdo, Incheon, Korea.
Kim et al. (2011), "Micro-nano hybrid structures with manipulated wettability using a two-step silicon etching on a large area," Nanoscale Research Letters 2011, 6:333.
Wier et al. (2006) "Condensation on Ultrahydrophobic Surfaces and Its Effect on Droplet Mobility: Ultrahydrophobic Surfaces Are Not Always Water Repellant," Langmuir 2006, 22, 2433-2436.
Gokhale et al. (2003) "Experimental investigation of contact angle, curvature, and contact line motion in dropwise condensation and evaporation," Journal of Colloid and Interface Science 259 (2003) 354-366.
Sumner et al. (2004) "The nature of water on surfaces of laboratory systems and implications for heterogeneous chemistry in the troposphere," Phys. Chem. Chem. Phys., 2004, 6, 604-613.
Tuteja et al. (2008) "Robust omniphobic surfaces," pp. 18200-18205, PNAS, vol. 105, No. 47.
Tuteja et al. (2008) "Robust omniphobic surfaces," pp. 18200-18205, PNAS, vol. 105, No. 47, Appendix.
Tuteja et al. (2007) "Designing Superoleophobic Surfaces," vol. 318 Science, pp. 1618-1622.
Vadgama et al. (2007) "Measurements of the contact angle between R134a and both aluminum and copper surfaces," Experimental Thermal and Fluid Science 31 (2007) 979-984.
Zheng et al. (2002) "Effect of Curvature, Contact Angle, and Interfacial Subcooling on Contact Line Spreading in a Microdrop in Dropwise Condensation," Langmuir 2002, 18, 5170-5177.
Zhong et al. (2006) "Condensation and Wetting Behavior on Surfaces with Micro-Structures: Super-hydrophobic and Super-hydrophilic," International Refrigeration and Air Conditioning Conference at Purdue, Jul. 17-20, 2006, Paper 828.
Goswami et al., 1997, "Foaming Characteristics of HFC Refrigerants," ASHRAE Journal, Jun. 1997, 39-44.
Miljkovic et al., Jan. 2012, "Effect of Droplet Morphology on Growth Dynamics and Heat Transfer During Condensation on Superhydrophobic Nanostructured Surfaces," ACS Nano, 6(2), 1776-1785.
Refrigerants Temperature Saturation Pressure Chart, unknown date, available at http://www.engineeringtoolbox.com/refrigerant-temperature-pressure-chart-d_1683.html.
Sumner et al., 2004, "The Nature of Water on Surfaces of Laboratory Systems and Implications for Heterogeneous Chemistry in the Troposphere," Phys. Chem. Chem. Phys, 6, 604-613.
First Office Action issued Aug. 23, 2013, from the State Intellectual Property Office of China for Chinese Patent Application No. 200980156945X.
Bolton Metal Products, *Cerro Alloy Material Property Data Sheet*. 2008: Bellefonte, PA.
Auger et al. (Mar. 2005) "Molding and Replication of Ceramic Surfaces with Nanoscale Resolution," *Small* 1(3):300-309.
Barbieri et al. (Web Release Jan. 3, 2007) "Water Wetting Transition Parameters of Perfluorinated Substrates with Periodically Distributed Flat-Top Microscale Obstacles," *Langmuir* 23(4):1723-1734.
Barthlott et al. (1997) "Purity of the Sacred Lotus, or Escape from Contamination in Biological Surfaces," *Planta* 202:1-8.
Baumeister et al. (2002) "Production of Metallic High Aspect Ratio Microstructures by Microcasting," *Microsyst. Technol.* 8(2-3):105-108.
Baumeister et al. (2004) "Microcasting of Parts Made of Metal Alloys," *Microsyst. Technol.* 10(3):261-264.
Baumeister et al. (2004) "Replication of LIGA Structures Using Microcasting," *Microsyst. Technol.* 10(6-7):484-488.
Baumeister et al. (2008) "New Results on Microcasting of Al Bronze," *Microsyst. Technol.* 14(12):1813-1821.
Baumeister et al. (2008) "Microcasting of Al Bronze: Influence of Casting Parameters on the Microstructure and the Mechanical Properties," *Microsyst. Technol.* 14(9-11):1647-1655.
Baumeister et al. (2006) "Microcasting of Al Bronze and a Gold Base Alloy Improved by Plaster-Bonded Investment," *Microsyst. Technol.* 12(8):773-777.
Bico et al. (Jul. 9, 2002) "Wetting of Textured Surfaces," *Colloids and Surf. A* 206(1-3):41-46.
Bohm et al. (2001) "Micro-Metalforming with Silicon Dies," *Microsyst. Technol.* 7(4):191-195.
Buzzi et al. (Web Release Aug. 17, 2007) "Metal Direct Nanoimprinting for Photonics," *Microelectron. Eng.* 85(2):419-424.
Cannon et al. (Sep. 2009) "Casting Metal Microstructures from a Flexible and Reusable Mold," *J. Micromech. Microeng.* 19(9):095016.
Cannon et al. (2006) "Molding Ceramic Microstructures on Flat and Curved Surfaces with and Without Embedded Carbon Nanotubes," *J. Micromech. Microeng.* 16(12):2554-2563.
Cannon, A. (Dec. 2006) "Unconventional Microfabrication Using Polymers," Masters Thesis, Georgia Institute of Technology, http://etdgatech.edu/theses/available/etd-08282006-171431/unrestricted/cannon_andrew_h_200612_mast.pdf.
Cassie et al. (1944) "Wettability of Porous Surfaces," *Trans Faraday Soc.* 40:546-551.
Chen et al. (Web Release Feb. 17, 2006) "Directly Patterning Metal Films by Nanoimprint Lithography with Low-Temperature and Low-Pressure," *Microelectron. Eng.* 83(4-9):893-896.

(56) References Cited

OTHER PUBLICATIONS

Chen et al. (Web Release Jan. 12, 2008) "Nanofabrication of SiC Templates for Direct Hot Embossing for metallic Photonic Structures and Meta Materials," *Microelectron. Eng.* 85(5-6):1147-1151.

Cheng et al. (2007) "The Effect of Metal-Film Thickness on Pattern Formation by Using Direct Imprint," *Jap. J. Appl. Phys. Part 1* 46(9B):6382-6386.

Cheng et al. (2007) "The Effects of Thin-Film Thickness on the Formation of Metallic Patterns by Direct Nanoimprint," *J. Mater. Process. Technol.* 191(1-3):326-330.

Choi et al. (Aug. 24, 2006) "Effective slip and friction reduction in nanograted superhydrophobic microchannels," *Physics of Fluids* 18(8):087105.

Extrand, C.W. (2004) "Criteria for Ultralyophobic Surfaces," *Langmuir* 20:5013-5018.

Guo (Feb. 2007) "Nanoimprint Lithography: Methods and Material Requirements," *Adv. Mater.* 19(4):495-513.

Haatainen et al. (Web Release Feb. 3, 2006) "Nickel Stamp Fabrication Using Step and Stamp Imprint Lithography," *Microelectron. Eng.* 83(4-9 SPEC ISS):948-950.

Hsieh et al. (May 18, 2007) "Fabrication of Subwavelength Metallic Structures by Using a Metal Direct Imprinting Process," *J. Phys. D* 40(11):3440-3447.

Hua et al. (Web Release Nov. 13, 2004) "Polymer Imprint Lithography with Molecular-Scale Resolution," *Nano Lett.* 4(12):2467-2471.

International Search Report and Written Opinion, Corresponding to International Application No. PCT/US2009/43307, Mailed Jul. 7, 2009.

International Search Report and Written Opinion, Corresponding to International Application No. PCT/US/2009/43306, Mailed Sep. 15, 2009.

International Search Report and Written Opinion, Corresponding to International Application No. PCT/US2009/49565, Mailed Aug. 27, 2009.

Jiang et al. (2008) "Direct Microscale Imprinting of Al at Room Temperature with Si Inserts," *Microsystem Technologies-Micro-and Nanosystems-Information Storage and Processing Systems* 14(6):815-819.

Kim et al. (2002) "Nanostructured surfaces for dramatic reduction of flow resistance in droplet-based microfluidics," presented at IEEE MEMS, Las Vegas, pp. 479-482.

Kim et al. (Web Release Oct. 5, 2005) "Fabrication of Aligned Carbon Nanotube-Filled Rubber Composite," *Scripta Materialia* 54:31-35.

Kumar et al. (Feb. 12, 2009) "Nanomoulding with Amorphous Metals," *Nature* 457:868-872.

Lee et al. (2008) "Impact of a Superhydrophobic Sphere onto Water," *Langmuir* 24(1):142-145.

Lee et al. (Aug. 2008) "Nano-Sized Patterns Derived from a SiCN Preceramic Polymer: Fabrication and their Characterization," *J. Phys. Chem. Solids* 69(8):2131-2136.

Li et al. (2007) "Superhrdrophobic Coatings on Curved Surfaces Featuring Remarkable Supporting Force," *J. Phys. Chem. C* 111(40):14813-14817.

Li et al. (2007) "What do we Need for a Superhydrophobic Surface? A Review on the Recent Progress in the Preparation of Superhydrophobic Surfaces," *Chem. Soc. Rev.* 36(8):1350-1368.

Lister et al. (Dec. 13, 2004) "Direct imprint of sub-10 nm features into metal using diamond and SiC stamps," *J. Vacuum Sci. Technol. B* 22(6):3257-3259.

Ma et al. (Web Release Oct. 11, 2006) "Superhydrophobic surfaces," *Current Opinion in Colloid & Interface Science* 11:193-202.

Makela et al. (Web Release Jun. 20, 2008) "Continuous double-sided roll-to-roll imprinting of polymer film," *Jpn. J. Appl. Phys.* 47(6):5142-5144.

Makela et al. (Web Release Feb. 2, 2007) "Continuous roll to roll nanoimprinting of inherently conducting polyaniline," *Microelectronic Engineering* 84(5-8):877-879.

Makela et al. (2005) "Utilizing roll-to-roll techniques for manufacturing source-drain electrodes for all-polymer transistors," *Synthetic Metals* 153(1-3):285-288.

Makela et al. (2003) "Roll-to-roll method for producing polyaniline patterns on paper," *Synthetic Metals* 135(1-3):41-42.

Makela et al. (2007) "Continuous 2-sided roll to roll nanopatterning of a polymer film," Kyoto, Japan: Institute of Electrical and Electronics Engineers Computer Society, Piscataway, NJ 08855-1331, United States, pp. 426-427.

Öner et al. (2000) "Ultrahydrophobic surfaces. Effects of topography length scales on wettability," *Langmuir* 16:7777-7782.

Pan et al. (2008) "Experiment and simulation of hot embossing of a bulk metallic glass with low pressure and temperature," *J. Micromech. Microeng.* 18(2):025010.

Pan et al. (Web Release Oct. 23, 2007) "Hot embossing of micro-lens array on bulk metallic glass," *Sens. Actuators A.* 141(2):422-431.

Pang et al. (1998) "Direct nano-printing on Al substrate using a SiC mold," *J. Vacuum Sci. Technol. B* 16(3):1145-1149.

Parker et al. (Apr. 2007) "Bulk micromachined titanium microneedles," *J. Microelectromech. Syst.* 16(2):289-295.

Pornsin-Sirirak et al. (2001) "Titanium-Alloy MEMs Wing Technology for a Micro Aerial Vehicle Application," *Sens. Actu. A* 89(1-2):95-103.

Quere, D. (2005) "Non-sticking drops," *Reports on Progress in Physics* 68(11):2495-2532.

Quere et al. (Web Release Jan. 11, 2008) "Non-adhesive lotus and other hydrophobic materials," *Philosophical Transactions of the Royal Society a-Mathematical Physical and Engineering Sciences* 366(1870):1539-1556.

Quere et al. (2008) "Non-Adhesive Lotus and Other Hydrophobic Materials," *Phil. Trans. Royal Soc.* 366(1870):1539-1556.

Quere, D. (Sep. 7, 2005) "Non Sticking Drops," *Rep. Prog. Phys.* 68:2495-2532.

Rath et al. (2006) "Investments for Casting Micro Parts with Base Alloys," *Microsyst. Technol.* 12(3):258-266.

Roach et al. (Web Release Oct. 30, 2007) "Progess in superhydrophobic surface development," *Soft Matter* 4:224-240.

Schmitz et al. (2007) "Fabrication of Micropatterned Surfaces by Improved Investment Casting," *Adv. Eng. Mater.* 9(4):265-270.

Shastry et al. (2005) "Engineering Surface Roughness to Manipulate Droplets in Microfluidic Systems," Presented at Micro Electro Mechanical Systems, MWMS 2005, 18th IEEE International Conference on.

Shastry et al. (2006) "Directing droplets using microstructured surfaces," *Langmuir* 22:6161-6167.

Steele et al. (2008) "Conformal Nanocomposite Spray Coatings on Micro-Patterned Surfaces for Superhydrophobicity," presented at ASME Fluids Engineering Conference, 2008.

Steele et al. (Jul. 30, 2010) "Conformal ZnO nanocomposite coatings on micro-patterned surfaces for superhydrophobicity," *Thin Solid Films* 518(19):5426-5431.

Van Kessel et al. (Aug. 1998) "MEMS-based projection display," *Proc. IEEE* 86(8):1687-1704.

Wang et al. (Web Release Jun. 10, 2008) "Sub-10-nm Wide Trench, Line and Hole Fabrication Using Pressed Self-Perfection," *Nano Lett.* 8(7):1986-1990.

Wenzel, R.N. (Aug. 1936) "Resistance of Solid Surfaces to Wetting by Water," *Ind. Eng. Chem.* 28(8):988-994.

Ybert et al. (Web Release Dec. 3, 2007) "Achieving large slip with superhydrophobic surfaces: Scaling laws for generic geometries," *Physics of Fluids* 19(12):123601.

Young, T. (1805) "III an Essay on the Cohesion of Fluids," *Phil. Trans. Royal Soc. London* 95:65-87.

Zhang et al. (2008) "Superhydrophobic Surfaces: From Structural Control to Functional Application," *J. Mater. Chem.* 18(6):621-633.

Office Action dated Nov. 14, 2014, corresponding to U.S. Appl. No. 13/322,437.

\* cited by examiner

805

806

907

905

1801

1802

METHODS FOR FABRICATING MICROSTRUCTURES

CROSS REFERENCE TO RELATED APPLICATION

This application claims the benefit of U.S. Provisional Application 61/153,028, filed on Feb. 17, 2009, which is hereby incorporated by reference in its entirety.

BACKGROUND OF THE INVENTION

This invention is in the field of casting/molding methods. This invention relates generally to methods of making molded or cast microstructured objects.

Casting and molding methods have long been utilized for producing and replicating objects. In general, the negative of an object is produced in a casting or molding process; that is, recessed features are replicated as raised features and vice versa. As such, at least two steps are generally required for replication of an object or features via casting or molding. First, a mold or form of an object is created around or on the master object, creating a negative of the master. For a casting method, the mold or form is filled with an end product material, creating a negative of the mold or form, which results in an end product generally resembling the master. In a molding method, the mold or form is stamped onto the end product material and the features of the master are replicated into the end product. Alternatively, the negative of the desired end product can be fabricated directly and used in a casting, molding or stamping process.

Only recently, however, have casting and molding methods been applied to microstructured objects. A limited number of U.S. patents and patent application Publications disclose cast or molded microstructured objects. For example, U.S. Patent Application Publication US 2006/0162896 discloses methods for forming microstructured metallic surfaces via single use wax molds. U.S. Pat. No. 5,735,985 discloses a method for high pressure compression molding of ceramic micro scale articles, for example a micro molded integrated ceramic light reflector. U.S. Pat. No. 7,237,337 discloses a heat dissipating apparatus having a microstructured capillary layer formed by injection molding or printing. U.S. Pat. No. 7,410,606 discloses casting methods for microstructured objects utilizing a mold fabricated from multiple thin layers stacked to form the desired micro mold.

SUMMARY OF THE INVENTION

Described herein are casting and molding methods useful for making microstructured objects. By including a plurality of microfeatures on the surface of an object, other characteristics may be imparted to the object, such as increased hydrophobicity. Some of the casting and molding methods described herein further allow for manufacture of objects having both microfeatures and macro features, for example microfeatures on or within macro features or selected macro feature regions.

In one embodiment, a method for making a microstructured end product comprises the steps of fabricating a microstructured prototype; casting a rubber from the microstructured prototype, thereby making a microstructured rubber; casting a ceramic from the microstructured rubber, thereby making a microstructured ceramic; casting a metal from the microstructured ceramic, thereby making a microstructured metal; and casting or molding an end product material from the microstructured metal, thereby making a microstructured end product. For some embodiments, the microstructured prototype comprises a first set of features having dimensions selected over the range of 10 nm to 100 μm and a second set of features having dimensions of 100 μm and larger, for example, selected over the range of 100 μm to 1 m, 1 mm to 1 m, 1 cm to 1 m, or 5 cm to 1 m. In embodiments, a pitch of the microfeatures is selected over the range of 10 nm to 100 μm.

For some embodiments, the microstructured prototype comprises a plurality of micro features, for example features having dimensions selected over the range of 10 nm to 100 μm, and one or more macro features, for example features having dimensions 100 μm and larger, such as selected over the range of 100 μm to 1 m. Optionally, at least a portion of the microfeatures are positioned on a curved surface of the microstructured prototype. In a specific embodiment, at least a portion of the microfeatures are located on and/or within the macro scale features. In a more specific embodiment, 80% to 100% of a surface area of the macro scale features is covered by the preselected pattern of microfeatures.

In embodiments, the features of the microstructured prototype are replicated in the rubber with high fidelity, for example with a replication fidelity selected over the range of 50% to 100%. An optional step of this method includes providing a release agent to the surface of the microstructured prototype before casting, for example a release agent selected from the group consisting of: napfin, paraffin wax, polysiloxanes, synthetic waxes, mineral oil, Teflon, fluoropolymers, silanes, thiols, and any combination of these. These and other release agents known to those skilled in the art may aid in separation of the cast rubber and the prototype from one another.

In a specific embodiment, a microstructured prototype comprises microfeatures having a preselected pattern. In some embodiments, the preselected pattern of microfeatures is transferred and/or replicated in a casting or molding process. In specific embodiments, the preselected pattern is transferred and/or replicated in every step of a multiple step casting and/or molding process, for example in a rubber casting step, a ceramic casting step, a metal casting step and/or an end product molding or casting step.

In an exemplary embodiment, the preselected pattern is a regular array of microfeatures. In another embodiment, the preselected pattern includes regions where the microfeatures have a first pitch and regions where the microfeatures have a second pitch, for example greater than the first pitch. As used herein, the term pitch refers to the spacing between adjacent microfeatures.

In one embodiment, a preselected pattern of microfeatures includes a region of microfeatures having a first cross sectional shape and a region of microfeatures having a second cross sectional shape, for example different from the first cross sectional shape. In one embodiment, a preselected pattern of microfeatures includes a region of microfeatures having multiple cross sectional shapes. In an embodiment, a preselected pattern of microfeatures refers to two or more arrays of microfeatures of two or more cross-sectional shapes. In a specific embodiment, the two or more arrays can be positioned side by side; that is, where the two arrays do not overlap. In another specific embodiment, the two or more arrays are positioned to overlap, and microfeatures having the two or more cross sectional shapes are interspersed within the overlapping arrays.

In an embodiment, a preselected pattern of microfeatures includes multiple dimensions of microfeatures, for example a bimodal or multimodal distribution of dimensions. In an exemplary embodiment, a preselected pattern of microfeatures includes a first group of microfeatures having dimensions selected from 10 nm to 1 µm and a second group of microfeatures having dimensions selected from 1 µm to 100 µm. In a specific embodiment, the sizes, shapes and positions of the microfeatures are preselected with micrometer-scale or nanometer-scale accuracy and/or precision. In a specific embodiment, each of the microfeatures in a preselected pattern have identical dimensions. In another embodiment, at least a portion of microfeatures in a preselected pattern have dimensions which differ. In embodiments, at least a portion of microfeatures in a preselected pattern have height/depth: width aspect ratios selected over the range of 1:2 to 7:1.

In some embodiments, the preselected pattern of microfeatures is engineered to impart specific physical characteristics to an object. For example, an ordered array of microfeatures can impart superhydrophobicity to the surface of an object. Physical characteristics which can be adjusted and imparted by a preselected pattern of microfeatures include, but are not limited to: hydrophobicity; hydrophilicity; self-cleaning ability; hydro and/or aerodynamic drag coefficients; optical effects such as prismatic effects, specific colors and directional dependent color changes; tactile effects; grip; and surface friction coefficients.

In general, the methods described herein can be utilized for making microstructured objects including molds, prototypes, primary objects, master objects, and end products. A method of this aspect for making a microstructured object comprises the steps of fabricating a microstructured prototype; and casting a rubber from the microstructured prototype, thereby making a microstructured rubber having rubber microfeatures. In some embodiments, the microstructured prototype is reusable and is used for casting multiple microstructured rubber objects. For example, after one microstructured rubber object is cast and separated from the microstructured prototype, the microstructured prototype is used again for casting an additional microstructured rubber object.

A further casting method additionally comprises the step of casting a ceramic from the microstructured rubber, thereby making a microstructured ceramic comprising ceramic microfeatures. In some embodiments, the microstructured rubber is reusable and is used for casting multiple microstructured ceramic objects. For example, after one microstructured ceramic is cast and separated from the microstructured rubber, the microstructured rubber is used again for casting an additional microstructured ceramic object. In an embodiment, the microstructured rubber comprises a plurality of microfeatures and/or one or more macro features. Optionally, at least a portion of the rubber microfeatures are positioned on a curved surface of the microstructured rubber. In a specific embodiment, at least a portion of the microfeatures are located on or within the macro scale features. In embodiments, the features of the microstructured rubber are replicated in the ceramic with high fidelity, for example with a replication fidelity selected over the range of 50% to 100%. Optionally, a debonding agent is provided to the surface of the microstructured rubber before casting, for example a debonding agent selected from the group consisting of: water, soap, paraffin wax, polysiloxanes, synthetic waxes, mineral oil, Teflon, fluoropolymers, silanes, thiols, and any combination of these. These and other debonding agents known to those skilled in the art may aid in separation of the cast ceramic and the rubber from one another.

A further casting method additionally comprises the step of casting a metal from the microstructured ceramic, thereby making a microstructured metal comprising metal microfeatures. In some embodiments, the microstructured ceramic is reusable and is used for casting multiple microstructured metal objects. For example, after one microstructured metal is cast and separated from the microstructured ceramic, the microstructured ceramic is used again for casting an additional microstructured metal object. In an embodiment, the microstructured ceramic comprises a plurality of microfeatures and/or one or more macro features. Optionally, at least a portion of the ceramic microfeatures are positioned on a curved surface of the microstructured ceramic. In a specific embodiment, at least a portion of the microfeatures are located on or within the macro scale features. In embodiments, the features of the microstructured ceramic are replicated in the metal with high fidelity, for example with a replication fidelity selected over the range of 50% to 100%.

Yet a further casting method additionally comprises the step of casting or molding an end product material from the microstructured metal, thereby making a microstructured end product comprising end product material microfeatures. In some embodiments, the microstructured metal is reusable and is used for casting or molding multiple microstructured end products. For example, after one microstructured end product is cast or molded and separated from the microstructured metal, the microstructured metal is used again for casting an additional microstructured end product. In an embodiment, the microstructured metal comprises a plurality of microfeatures and/or one or more macro features. Optionally, at least a portion of the metal microfeatures are positioned on a curved surface of the microstructured metal. In a specific embodiment, at least a portion of the microfeatures are located on or within the macro scale features. In embodiments, the features of the microstructured metal are replicated in the end product with high fidelity, for example with a replication fidelity selected over the range of 50% to 100%. For some embodiments, the end product comprises a plurality of microfeatures and/or one or more macro features. Optionally, at least a portion of the end product material microfeatures are positioned on a curved surface of the microstructured end product.

For some embodiments, the features of a cast microstructured object include an additional layer of roughness, for example a roughness inherent to the casting material itself and/or comprising features smaller in size than the features being cast. In one embodiment, the additional layer of roughness corresponds to the size of particles which make up a ceramic casting material. In an exemplary embodiment, the cast material comprises particles having sizes smaller than the features of the object being cast. In specific embodiments, the casting material comprises spherical particles having diameters selected from 1 nm to 100 µm. In a preferred embodiment, the particles of the casting material have sizes less than one-tenth the size of the features being cast. When a cast object includes an additional layer of roughness, in an embodiment, the additional layer of roughness is transferred during a subsequent casting process to additional cast objects. For example, when a microstructured ceramic includes an additional layer of roughness, the roughness is replicated in a microstructured metal cast from the microstructured ceramic. In a further embodiment, a microstructured metal having an additional layer of roughness will transfer the additional layer of roughness to an end product cast to or molded from the microstructured metal.

In embodiments, a useful microstructured object comprises a plurality of microfeatures, for example features including, but not limited to: holes, pillars, steps, ridges, curved regions, raised regions, recessed regions, other standard geometric shapes known to those skilled in the art of microfabrication and any combination of these. Optionally at least a portion of the microfeatures are positioned on a curved surface of the microstructured object. In specific embodiments, the plurality of microfeatures have dimensions selected over the range of 10 nm to 100 µm, for example heights, widths and/or lengths. Useful cross-sectional shapes for the microfeatures include, but are not limited to: circles, ellipses, triangles, squares, rectangles, polygons, stars, hexagons, letters, numbers, mathematical symbols, other geometric shapes known to those skilled in the art of microfabrication and any combination of these.

In an embodiment, a useful microstructured object comprises one or more macro scale features, for example features including, but not limited to: channels, grooves, bumps, ridges, recessed regions, raised regions, curved regions and any combination of these or other useful macro scale features. In a specific embodiment, the macro scale features have dimensions of 100 µm and larger, for example, selected over the range of 100 µm to 1 m, 1 mm to 1 m, 1 cm to 1 m, or 5 cm to 1 m.

Also provided herein are methods for fabricating a microstructured prototype. In a specific method, fabricating a microstructured prototype comprises providing a prototype; and attaching a microstructured polymer to at least a portion of the surface of the prototype. For some embodiments, the microstructured polymer includes a preselected pattern of microfeatures. For example, the microstructured polymer may comprise a lithographically patterned flexible polymer and/or a pattern made using methods including, but not limited to micropatterning techniques such as photolithography, photoablation, laser ablation, laser patterning, laser machining, x-ray lithography, e-beam lithography, nano-imprint lithography and any combination of these. In a specific embodiment, the attaching step comprises flexing at least a portion of the microstructured polymer and inserting and/or attaching at least a portion of the microstructured polymer into and/or onto a macro scale feature of the prototype. In an embodiment, a flexible polymer is a flexible elastomer.

In a specific embodiment of this aspect, fabricating a microstructured prototype comprises the steps of providing a semiconductor wafer; patterning the semiconductor wafer with a preselected pattern of microfeatures; molding an uncured flexible polymer to the patterned semiconductor wafer; curing the polymer, thereby forming a microstructured flexible polymer having the preselected pattern of microfeatures; removing the microstructured flexible polymer from the patterned semiconductor wafer; providing a prototype having one or more macro scale features; and deforming at least a portion of the microstructured flexible polymer so as to conform the microstructured flexible polymer to at least a portion of the surface of the one or more macro scale features of the prototype. In a specific embodiment, a prototype is a large-area prototype. For some embodiments, multiple microstructured flexible polymer sections are required to cover one or more macro scale features of a large-area prototype. In an embodiment, a flexible polymer is a flexible elastomer.

In another embodiment of this aspect, fabricating a microstructured prototype comprises providing a prototype; depositing uncured polymer onto at least a portion of the surface of the prototype; attaching a microstructured polymer to at least a portion of the surface of a macro mold; bringing the macro mold and microstructured polymer into contact with the prototype and the uncured polymer; applying heat and pressure to cure the uncured polymer; releasing the macro mold and microstructured polymer from the prototype and cured polymer. For some embodiments, the microstructured polymer includes a preselected pattern of microfeatures. In a specific embodiment, the microstructured polymer comprises a lithographically patterned flexible polymer. In a specific embodiment, the attaching step comprises flexing at least a portion of the microstructured polymer and inserting and/or attaching at least a portion of the microstructured polymer into and/or onto a macro scale feature of the macro mold.

In a specific embodiment of this aspect, fabricating a microstructured prototype comprises the steps of providing a semiconductor wafer; patterning the semiconductor wafer with a preselected pattern of microfeatures; molding an uncured first polymer to the patterned semiconductor wafer; curing the first polymer, thereby forming a microstructured flexible polymer having the preselected pattern of microfeatures; removing the microstructured flexible polymer from the patterned semiconductor wafer; providing a macro mold having one or more macro scale features; deforming at least a portion of the microstructured flexible polymer so as to conform the microstructured flexible polymer to at least a portion of the surface of the one or more macro scale features of the macro mold; providing a prototype having one or more macro scale features; depositing an uncured second polymer onto at least a portion of a surface of the one or more macro scale features of the prototype; bringing the macro mold and microstructured flexible polymer into contact with the prototype and the uncured second polymer; curing the uncured second polymer, thereby making a microstructured second polymer having the preselected pattern of microfeatures; and releasing the macro mold and microstructured flexible polymer from the prototype and microstructured second polymer.

In another embodiment, fabricating a microstructured prototype comprises providing a prototype and patterning the prototype with a preselected pattern of microfeatures. Useful methods for patterning the prototype with a preselected pattern of microfeatures include, but are not limited to: drilling; milling; ion milling; machining; electro discharge machining; electroplating; ink jet printing; electrohydrodynamic ink jet printing; plasma etching; chemical etching; photolithography; x-ray lithography; electron beam lithography; soft lithography; embossing; stamping molding; forging; etching with a plasma, gas or liquid; probe microscopy; atomic force microscopy; nano-indentation microscopy; chemical vapor deposition; physical vapor deposition; evaporation; electrospinning; and weaving microfibers or strands onto or into the surface. These and other patterning methods may further be combined with the above methods which utilize polymers; for example, the polymers and/or prototype may be patterned directly using any of the above methods.

In embodiments where a semiconductor wafer is patterned, methods known to those of skill in the art may be utilized. For certain embodiments, a semiconductor wafer includes a layer of photoresist. As used herein, a patterned semiconductor wafer refers to a semiconductor wafer having a pattern imparted directly into the semiconductor material, a semiconductor wafer having unpatterned semiconductor material and a patterned overlayer, and/or a semiconductor wafer having patterned semiconductor material and a patterned overlayer. Specific patterning methods include, but are not limited to photolithography, photoablation, laser ablation, laser patterning, laser machining, x-ray lithography, e-beam lithography and nano-imprint lithography. Semiconductor wafer patterning methods also include etching methods and methods useful for patterning overlayers, for example photoresist layers.

Without wishing to be bound by any particular theory, there can be discussion herein of beliefs or understandings of underlying principles relating to the invention. It is recognized that regardless of the ultimate correctness of any mechanistic explanation or hypothesis, an embodiment of the invention can nonetheless be operative and useful.

DETAILED DESCRIPTION OF THE INVENTION

Figure 1:
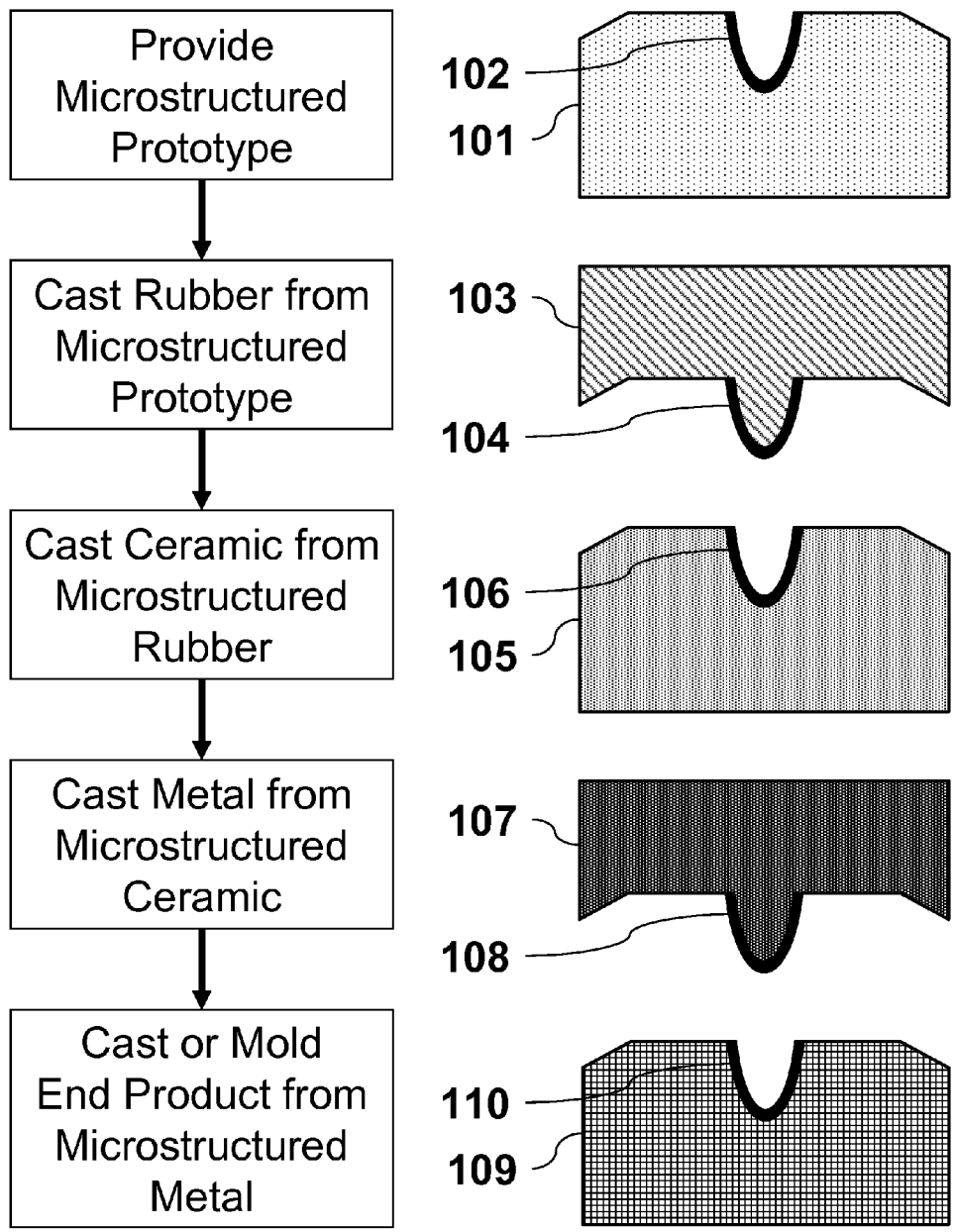
FIG. 1 provides an overview of a method of making a microstructured object.

In general the terms and phrases used herein have their art-recognized meaning, which can be found by reference to standard texts, journal references and contexts known to those skilled in the art. The following definitions are provided to clarify their specific use in the context of the invention.

"Microstructured object" refers to an object having a plurality of microfeatures. Specific microstructured objects include microstructured prototypes, microstructured rubbers, microstructured ceramics, microstructured metals and microstructured end products.

"Preselected pattern" refers to an arrangement of objects in an organized, designed or engineered fashion. For example, a preselected pattern of microfeatures can refer to an ordered array of microfeatures. In an embodiment, a preselected pattern is not a random and/or statistical pattern.

"Casting" refers to a manufacturing process in which a liquid material or a slurry is poured or otherwise provided into, onto and/or around a mold or other primary object, for example for replicating features of the mold or primary object to the cast material. Casting methods typically include a cooling or curing process to allow the cast material and/or precursor material to set and/or become solid or rigid. Some casting methods also include a final sintering, firing or baking step to cure a "green" or not finally cured object. For some casting methods, features of the mold or primary object are incorporated in the cast material as it sets. In specific embodiments, materials such as rubber, ceramic and/or metal are cast from molds or primary objects which are compatible with the liquid or slurry material; that is, the molds or primary objects do not deform, melt, and/or are not damaged when brought into contact with the liquid or slurry material.

"Molding" or "stamping" refers to a manufacturing process in which a material is shaped or forced to take a pattern using a rigid mold or other primary object. Molding methods typically include placing the mold or primary object in contact with the material to be molded and applying a force to the mold, primary object and/or material to be molded. For some molding methods, features of the mold or primary object are replicated in the material to be molded during the molding process. In a specific embodiment, an end product, such as rubber, is molded from a patterned metal object.

"Release agent" refers to a substance provided to the surface of a mold or primary object from which a rubber is to be cast to enhance and/or assist in the removal of the cast rubber from the mold or primary object. Specific release agents include materials selected from the group consisting of: napfin, paraffin wax, polysiloxanes, synthetic waxes, mineral oil, Teflon, fluoropolymers, silanes, thiols, other release agents known to those skilled in the art, and any combination of these. Some release agents are also useful as debonding agents.

"Debonding agent" refers to a substance provided to the surface of a mold or primary object from which a ceramic is to be cast to enhance and/or assist in the removal of the cast ceramic from the mold or primary object. Specific debonding agents include materials selected from the group consisting of: water, soap, paraffin wax, polysiloxanes, synthetic waxes, mineral oil, Teflon, fluoropolymers, silanes, thiols, other debonding agents known to those skilled in the art, and any combination of these. Some debonding agents are also useful as release agents.

"End product" refers to an object formed at the finish of a sequence of manufacturing steps. Some end products are suitable for use in a subsequent manufacturing process. Other end products, however, require additional processing, for example painting or other finalizing procedures. Some end products reach their final form at the finish of the sequence of manufacturing steps and are thus suitable for sale or for their intended use. Specific end products include, but are not limited to: moldable objects; sporting goods, such as grips, baseball bats, golf clubs, footballs, basketballs; cooking utensils; kitchenware; bathroom items such as toilets, sinks, tiles, bath tubs, shower curtains; handheld controllers, such as for gaming or equipment operation; bottles; computer keyboards; computer mice; jewelry; shoes; belts; helmets; pipes, including both inner and outer surfaces; candles; glass jars and jar lids; candy; turbine blades; pump rotors; heat sinks; insignia; windows; hoses; coolers; tires; tire treads; wheels; and sheets of polymer.

"Prototype" refers to an object which serves as the basis for subsequent molding or casting processes. In an exemplary embodiment, a prototype is constructed to resemble or include the features of a final cast or molded object or end product.

"Flexible" refers to a property of an object which is deformable in a reversible manner such that the object or material does not undergo damage when deformed, such as damage characteristic of fracturing, breaking, or inelastically deforming. Flexible polymers are useful with the methods described herein. Specific flexible polymers include, but are not limited to: rubber (including natural rubber, styrene-butadiene, polybutadiene, neoprene, ethylene-propylene, butyl, nitrile, silicones), acrylic, nylon, polycarbonate, polyester, polyethylene, polypropylene, polystyrene, polyvinyl chloride, polyolefin, elastomers and other flexible polymers known to those of skill in the art. In certain embodiments, flexible objects or materials can undergo strain levels selected over the range of 1% to 1300%, 10% to 1300%, or 100% to 1300% without resulting in mechanical failure (e.g., breaking, fracturing or inelastically deforming). In some embodiments, flexible objects or materials can be deformed to a radius of curvature selected over the range of 100 µm to 3 m without resulting in without resulting in mechanical failure (e.g., breaking, fracturing or inelastically deforming).

"Macro mold" refers to an object mold for shaping or molding an object in a molding, casting or contact process. In some embodiments, a macro mold is used to simultaneously shape an object on a macro scale, for example where features are larger than 1 mm, such as 1 mm to 1 m, 1 cm to 1 m, or 5 cm to 1 m, and impart microfeatures to the surface of the object.

"Primary object" refers to the object used in a casting or molding process from which the cast or molded object takes its shape, pattern and/or features. In a specific embodiment, a primary object refers to a prototype or master object; however, a primary object can also refer to any object from which the cast or molded object takes its shape, pattern and/or features during a casting or molding process.

"Cast object" refers to the object which is formed during a casting process and is made of a cured and/or cooled liquid, slurry and/or precursor material.

"Microfeatures" and "microstructures" refers to features, on the surface of an object or mold, having an average width, depth, length and/or thickness of 100 µm or less or selected over the range of 10 nm to 100 µm, for example 10 nm to 10 µm or 10 nm to 1 µm. In certain embodiments, microfeatures are located on and/or within at least a portion of larger scale features (e.g., macro scale features) of an object, covering at least a portion of the surface area of the larger scale features are with microfeatures. In some embodiments, microfeatures include relief features. In some embodiments, microfeatures include recessed features.

"Macro scale features" refers to features, on the surface of an object or mold, having an average width, depth, length and/or thickness of 100 µm or greater, for example 1 mm or greater, 5 mm or greater, 1 cm or greater, 5 cm or greater or selected over the range of 100 µm to 1 m, 1 mm to 1 m, 1 cm to 1 m or 5 cm to 1 m. In some embodiments, macro scale features include relief features. In some embodiments, macro scale features include recessed features.

"Fidelity" refers to the quality of a cast or molded object; fidelity can also refer to the ability of features to be replicated in a cast or molded object during a casting or molding process. "High fidelity" specifically refers to the situation where a majority of the features of the mold or primary object are replicated in the molding or casting process to the cast or molded objects, for example 50% to 100% of the features, 75% to 100% of the features, 90% to 100% of the features or 100% of the features.

"Replication" and "replicate" refer to the situation where features are transferred and/or recreated during casting and/or molding processes. Replicated features generally resemble the original features they are cast or molded from except that the replicated features represent the negative of the original features; that is where the original features are raised features, the replicated features are recessed features and where the original features are recessed features, the replicated features are raised features. In a specific embodiment, micropillars in a master object are replicated as microholes in a cast object and microholes in the master object are replicated is micropillars in the cast object.

"Polymer" refers to a macromolecule composed of repeating structural units connected by covalent chemical bonds or the polymerization product of one or more monomers, often characterized by a high molecular weight. The term polymer includes homopolymers, or polymers consisting essentially of a single repeating monomer subunit. The term "polymer" also includes copolymers, or polymers consisting essentially of two or more monomer subunits, such as random, block, alternating, segmented, graft, tapered and other copolymers. Polymers useable in the present invention may be organic polymers or inorganic polymers and may be in amorphous, semi-amorphous, crystalline or partially crystalline states. Cross linked polymers having linked monomer chains are particularly useful for some applications of the present invention. Polymers useable in the methods, devices and device components of the present invention include, but are not limited to, plastics, elastomers, thermoplastic elastomers, elastoplastics, thermostats, thermoplastics and acrylates. Exemplary polymers include, but are not limited to, acetal polymers, biodegradable polymers, cellulosic polymers, fluoropolymers, nylons, polyacrylonitrile polymers, polyamide-imide polymers, polyimides, polyarylates, polybenzimidazole, polybutylene, polycarbonate, polyesters, polyetherimide, polyethylene, polyethylene copolymers and modified polyethylenes, polyketones, poly(methyl methacrylate, polymethylpentene, polyphenylene oxides and polyphenylene sulfides, polyphthalamide, polypropylene, polyurethanes, styrenic resins, sulfone based resins, vinyl-based resins, rubber (including natural rubber, styrene-butadiene, polybutadiene, neoprene, ethylene-propylene, butyl, nitrile, silicones), acrylic, nylon, polycarbonate, polyester, polyethylene, polypropylene, polystyrene, polyvinyl chloride, polyolefin or any combinations of these. Exemplary elastomers include, but are not limited to silicon containing polymers such as polysiloxanes including poly(dimethyl siloxane) (i.e. PDMS and h-PDMS), poly(methyl siloxane), partially alkylated poly(methyl siloxane), poly(alkyl methyl siloxane) and poly(phenyl methyl siloxane), silicon modified elastomers, thermoplastic elastomers, styrenic materials, olefenic materials, polyolefin, polyurethane thermoplastic elastomers, polyamides, synthetic rubbers, polyisobutylene, poly(styrene-butadiene-styrene), polyurethanes, polychloroprene and silicones. In an embodiment, a flexible polymer is a flexible elastomer.

"Ceramic" refers to an inorganic, nonmetallic material which is cured in a heating and/or drying process. As used herein, the term ceramic includes green and finally cured ceramic materials. In embodiments, some ceramics and ceramic precursors undergo a final curing step (e.g., sintering, firing or baking) before undergoing further processing or use. Specific ceramics include, but are not limited to: porcelain; crystalline ceramics; glass ceramics; zeolites; earthenware;

plaster; oxides such as alumina and zirconia; non-oxides such as carbides, borides, nitrides and silicides; composite ceramics such as particulate reinforced ceramics and combinations of oxides and non-oxides. Specific ceramic precursors include clays, ceramic powders and slurries, such as slurries comprising water and another ceramic precursor or a ceramic powder. In some embodiments, ceramic precursors include organic components which are reacted away (e.g., by combustion) or otherwise incorporated or removed during the curing process. In specific embodiments, ceramics are useful for casting metals, as certain ceramic materials are capable of withstanding the conditions (e.g., temperatures) associated with molten metals; that is, certain ceramics do not undergo damage, breakage or deformations when brought into contact with molten or liquid metallic materials. In an embodiment, a ceramic is capable of withstanding high temperatures (e.g., above 500° C.) without undergoing damage.

Methods are described herein for the production of microstructured objects. Specific methods are useful with one another, for example they can be performed in series for the manufacture of a sequence of microstructured objects. The microstructured objects made by the methods described herein include regions of microfeatures which can give the object a variety of useful properties. For example, the microfeatures can impart an increased hydrophobicity to an object and/or can give an object a self-cleaning ability. The microfeatures can also impart optical effects to an object, for example giving an object a prismatic effect, a specific color, or a directional dependent color change or color flop (e.g. the object appears a specific color when viewed from one angle and another color when viewed from another direction).

The microfeatures can also impart an increase of surface friction or grip to an object, and/or can give an object a specific tactile sensation such as feeling fuzzy, rough or squishy when touched. The microfeatures can also be located on a specific area or over the entire surface area of an object. For example, these embodiments can be useful for decreasing drag caused by turbulence of an object moving through a fluid (e.g., similar to the dimpling on a golf ball).

In a specific embodiment, the microfeatures can modify the heat transfer characteristics of an object, for example by changing the surface area of an object, changing how the surface interacts with fluids, or changing the behavior of nucleation sites. In a specific embodiment, the microfeatures can result in a decreased heat transfer by conduction, for example when the microfeatures have a high aspect ratio only the tops of the microfeatures will be in contact with another object for conductive heat transfer while the voids between surface features will not transfer heat well.

Microstructures can also be electrically conductive, for example metal microstructures or microstructures comprised of an electrically conductive polymer. These types of electrically conductive microstructures are useful, for example, as an array of electrical leads for electronic devices. The electrically conductive microstructures, for example, can be embossed directly onto the surface of an object.

In one aspect, microstructured tires are a specifically useful end product. Microstructured tires have increased hydrophobicity on specific patterns compared to other tires. A microstructured tire refers to a tire having a plurality of microfeatures on at least a portion of the surface of a tire. In a specific embodiment, a microstructured tire refers to a tire having microstructures on the tread portion of an automobile tire. Microstructuring of other regions of a tire is also useful, for example microstructured sidewalls or other regions of a tire may have reduced drag, increasing overall performance.

FIG. 1 provides an overview of an exemplary method for making a microstructured object. First, a microstructured prototype 101 having a region of microfeatures 102 on a curved surface of microstructured prototype 101 is provided. Next, a rubber is cast to the microstructured prototype 101, making a microstructured rubber 103. The prototype microfeatures 102 are replicated in the casting process as rubber microfeatures 104 on a curved surface of microstructured rubber 103. Next, a ceramic is cast to the microstructured rubber 103, making a microstructured ceramic 105. The rubber microfeatures 104 are replicated in the casting process as ceramic microfeatures 106 on a curved surface of microstructured ceramic 105. Next, a metal is cast to the microstructured ceramic 105, making a microstructured metal 107. The ceramic microfeatures 106 are replicated in the casting process as metal microfeatures 108 on a curved surface of microstructured metal 107. Finally an end product is cast to or molded from the microstructured metal 107, making a microstructured end product 109. The metal microfeatures 108 are replicated in the casting or molding process as end product microfeatures 110 on a curved surface of microstructured end product 109.

Figure 2:
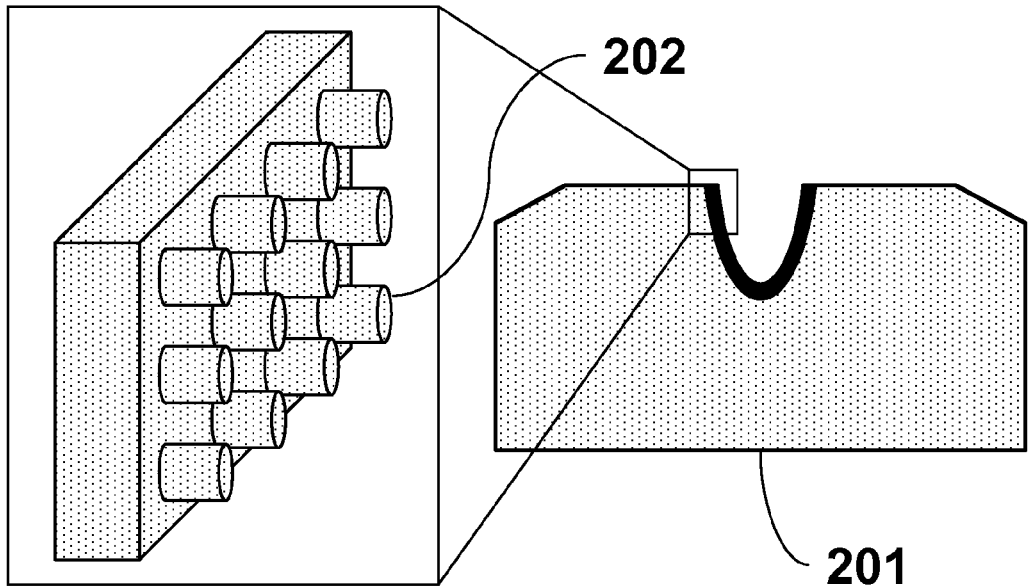
FIG. 2 shows detail of a microstructured prototype with an expanded view of surface microfeatures.

FIG. 2 depicts further detail of a microstructured prototype 201 embodiment showing an expanded view of microfeatures 202. In this embodiment, the microfeatures 202 are micropillars; that is they are cylindrically shaped structures extending from the surface of the prototype. For some embodiments, however, the microfeatures can include holes, pillars, steps, ridges, curved regions, recessed regions, raised regions, and any combination of these employing any cross-sectional shape including circles, ellipses, triangles, squares, rectangles, polygons, stars, hexagons, letters, numbers, mathematical symbols and any combination of these.

Figure 3:
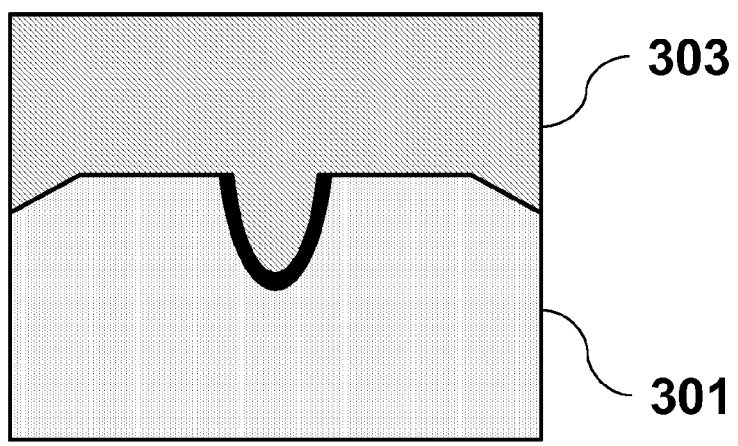
FIG. 3 shows a rubber cast to a microstructured prototype.
Figure 4:
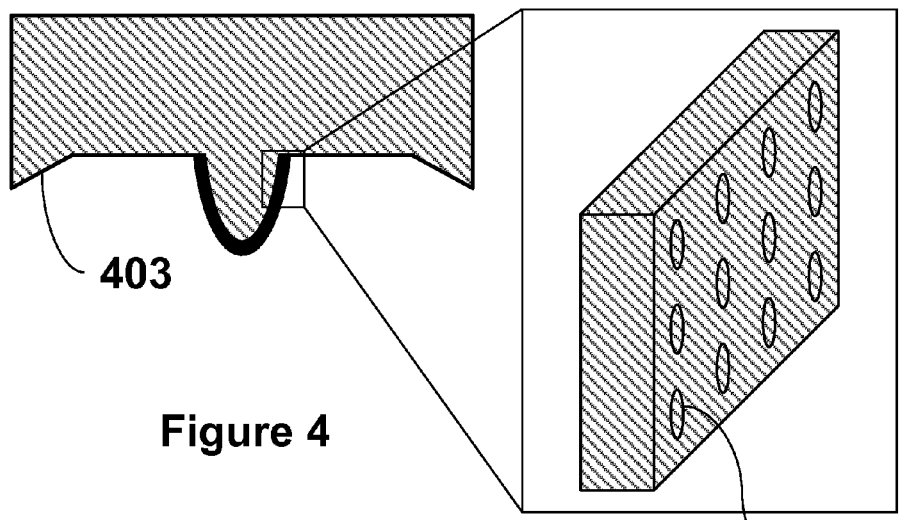
FIG. 4 shows detail of a microstructured rubber with an expanded view of surface microfeatures.
Figure 5:
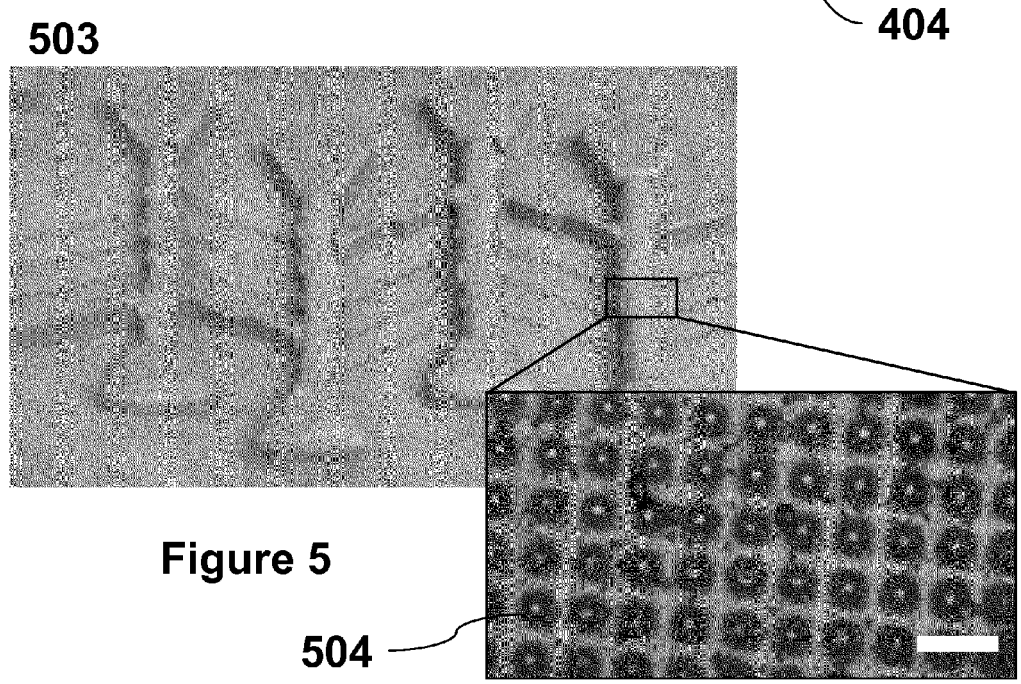
FIG. 5 shows an image of a microstructured rubber with a magnified image of rubber microfeatures.

FIG. 3 shows a rubber 303 cast to a microstructured prototype 301. Microstructured prototype 301 can be used multiple times to cast rubber with high casting fidelity. FIG. 4 depicts further detail of a microstructured rubber 403 embodiment showing an expanded view of microfeatures 404. In this embodiment, the microfeatures 404 are holes which represent the negative of micropillars such as shown in FIG. 2. FIG. 5 shows an image of a microstructured rubber 503 cast from a microstructured prototype, with an expanded image of rubber microfeatures 504 replicated with high fidelity during the casting process. The bar in the expanded image represents a distance of 50 μm.

Figure 6:
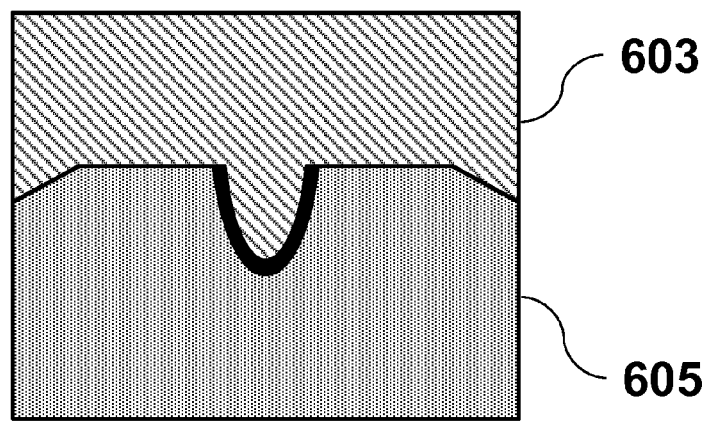
FIG. 6 shows a ceramic cast to a microstructured rubber.
Figure 7:
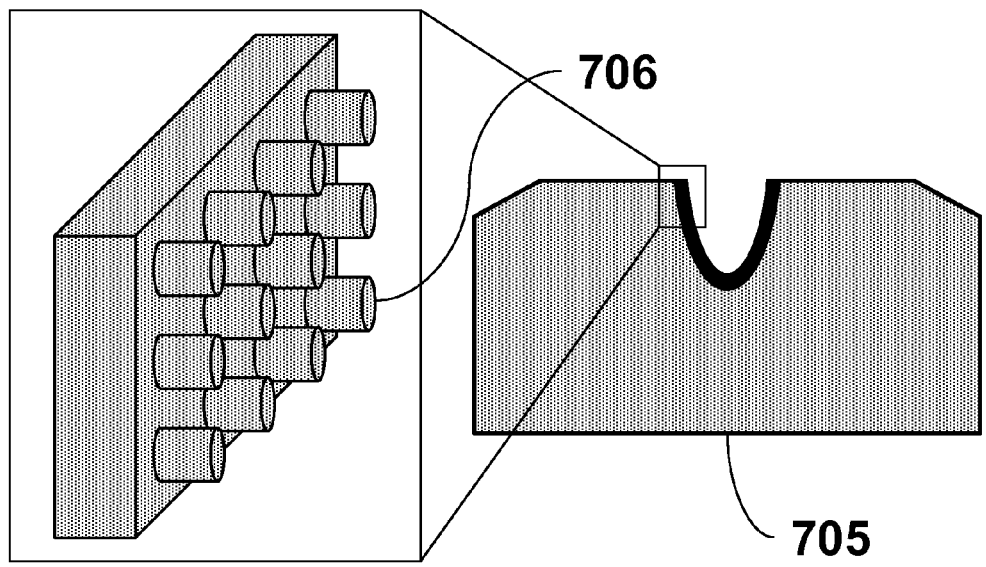
FIG. 7 shows detail of a microstructured ceramic with an expanded view of surface microfeatures.
Figure 8:
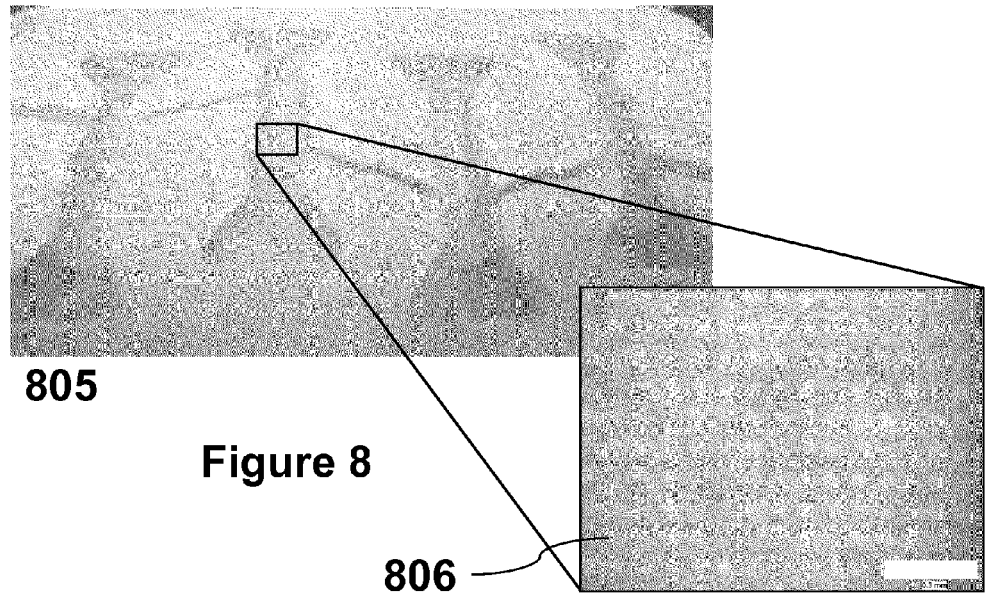
FIG. 8 shows an image of a microstructured ceramic with a magnified image of ceramic microfeatures.

FIG. 6 shows a ceramic 605 cast to a microstructured rubber 603. Microstructured rubber 603 can be used multiple times to cast ceramic with high casting fidelity. FIG. 7 depicts further detail of a microstructured ceramic 705 embodiment showing an expanded view of microfeatures 706. In this embodiment, the microfeatures 706 are pillars, similar to those shown in FIG. 2, which represent the negative of holes such as shown in FIG. 4. FIG. 8 shows an image of a microstructured ceramic 805 cast from a microstructured rubber, with an expanded image of ceramic microfeatures 806 replicated with high fidelity during the casting process. The bar in the expanded image represents a distance of 300 μm.

Figure 9:
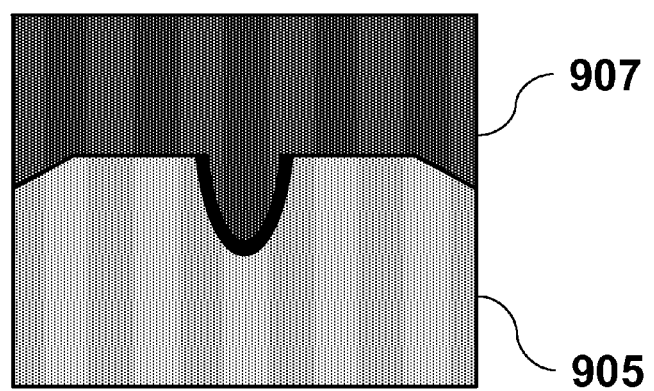
FIG. 9 shows a metal cast to a microstructured ceramic.
Figure 10:
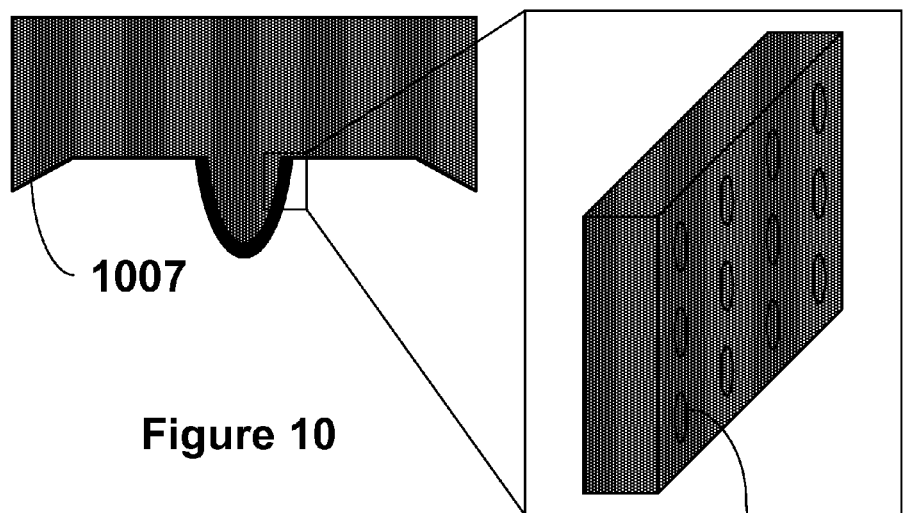
FIG. 10 shows detail of a microstructured metal with an expanded view of surface microfeatures.
Figure 11:
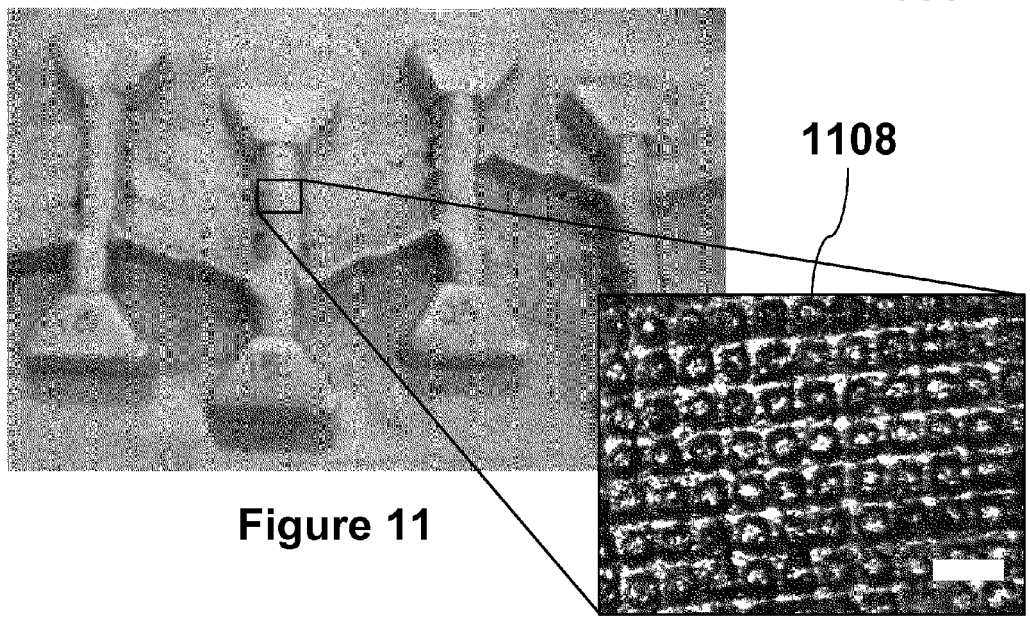
FIG. 11 shows an image of a microstructured metal with a magnified image of metal microfeatures.

FIG. 9 shows a metal 907 cast to a microstructured ceramic 905. FIG. 10 depicts further detail of a microstructured metal 1007 embodiment showing an expanded view of microfeatures 1008. In this embodiment, the microfeatures 1008 are holes, similar to those shown in FIG. 4, which represent the negative of pillars such as shown in FIGS. 2 and 7. FIG. 11 shows an image of a microstructured metal 1107 cast from a microstructured ceramic, with an expanded image of metal microfeatures 1108 replicated with high fidelity during the casting process. The bar in the expanded image represents a distance of 200 µm.

Figure 12:
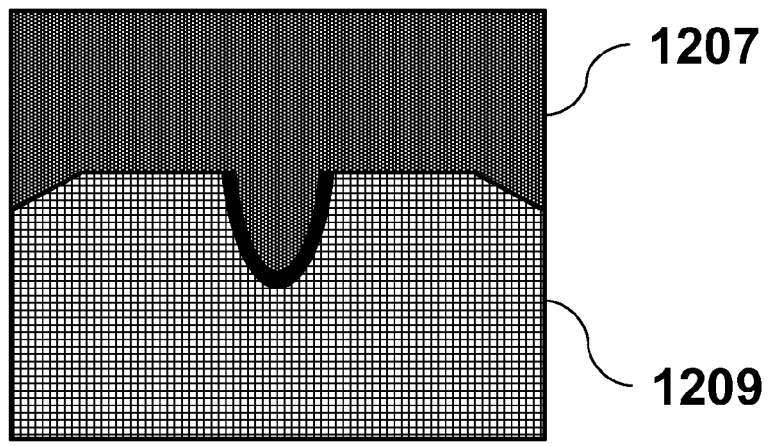
FIG. 12 shows an end product cast or molded by microstructured metal.
Figure 13:
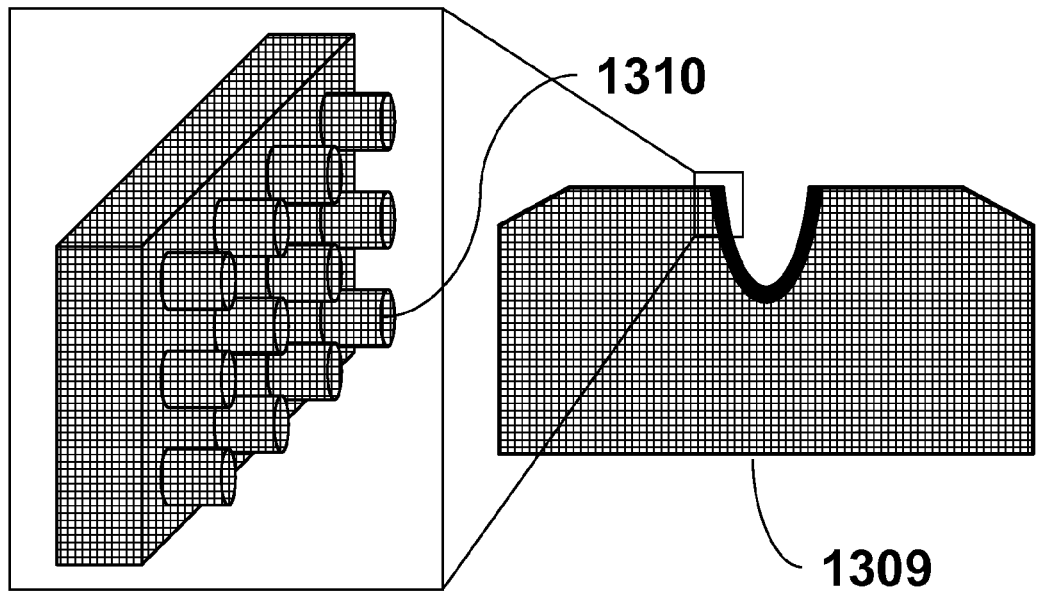
FIG. 13 shows detail of a microstructured end product with an expanded view of surface microfeatures.
Figure 14:
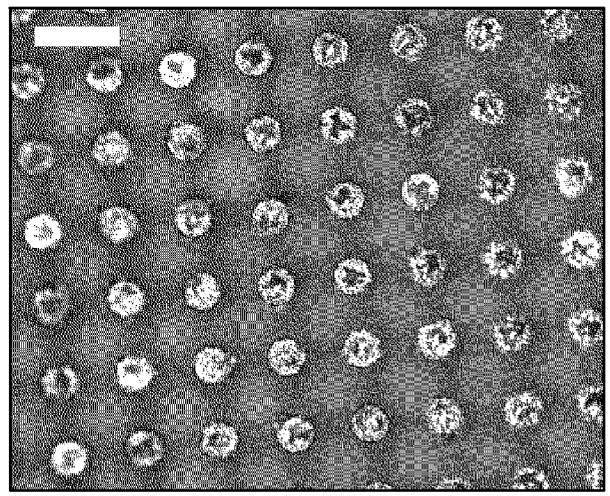
FIG. 14 shows a magnified image of end product microfeatures.
Figure 15:
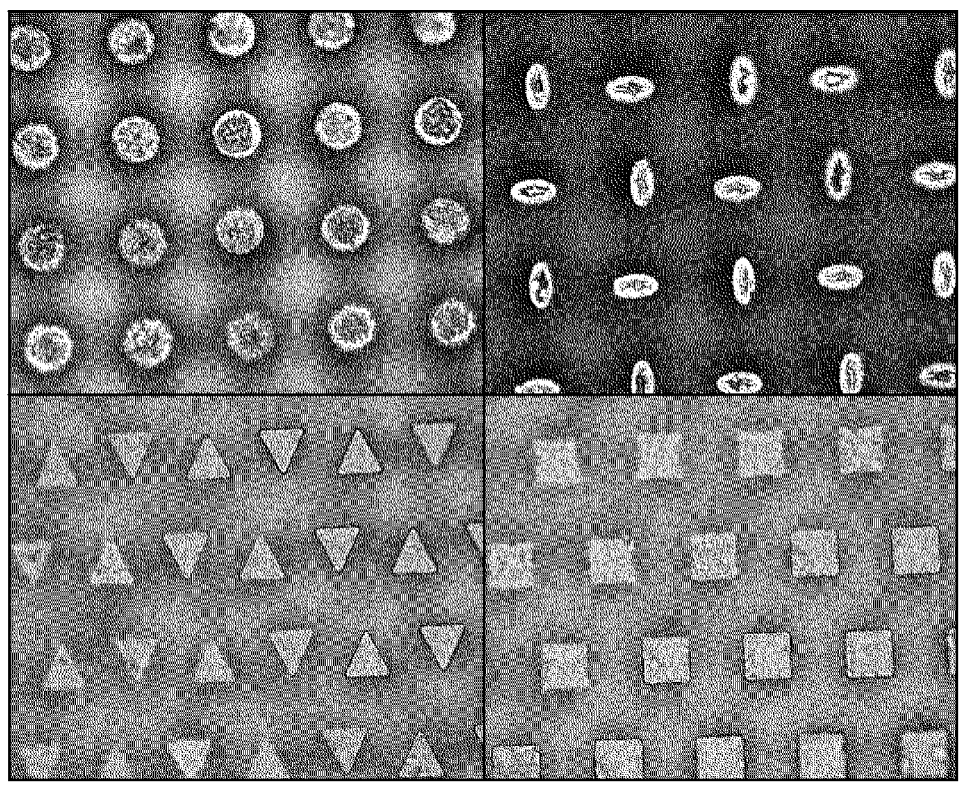
FIG. 15 shows magnified images of a variety of shapes of end product microfeatures.

FIG. 12 shows an end product 1209 cast to or molded from a microstructured metal 1207. FIG. 13 depicts further detail of a microstructured end product 1309 embodiment showing an expanded view of microfeatures 1310. In this embodiment, the microfeatures 1310 are pillars, similar to those shown in FIGS. 2 and 7, which represent the negative of holes such as shown in FIGS. 4 and 10. FIG. 14 shows an image of microfeatures replicated with high fidelity during the casting or molding process. The bar in the figure represents a distance of 60 µm. FIG. 15 shows images of additional microfeature embodiments having cross sectional shapes of circles, ellipses, triangles and squares. The ellipse and triangle embodiments show that there can be a variety of orientations of the cross sectional shapes.

Figure 16:
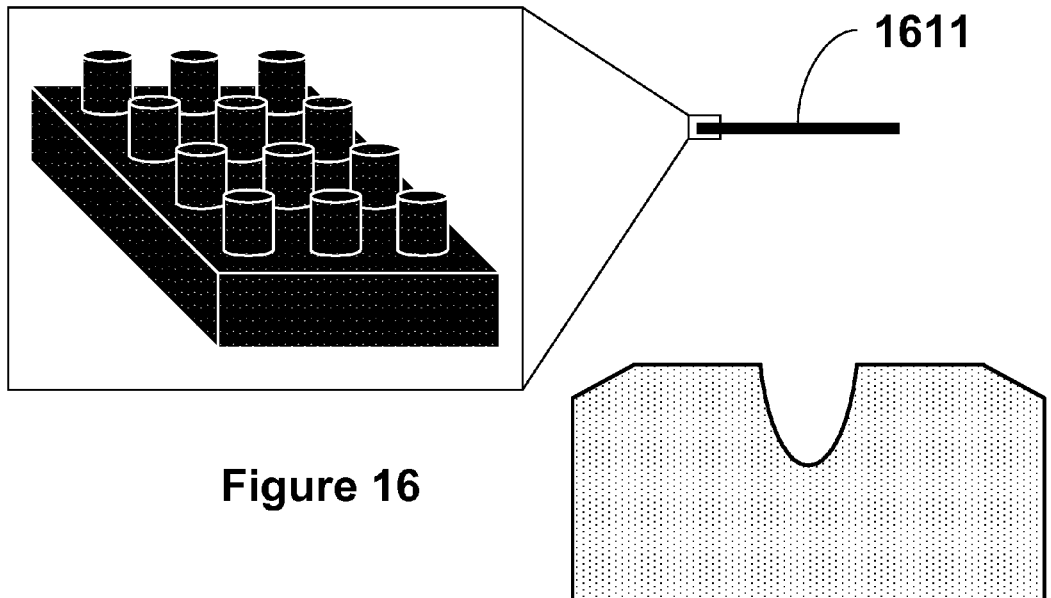
FIG. 16 shows a microstructured flexible polymer for attachment to a prototype.
Figure 17:
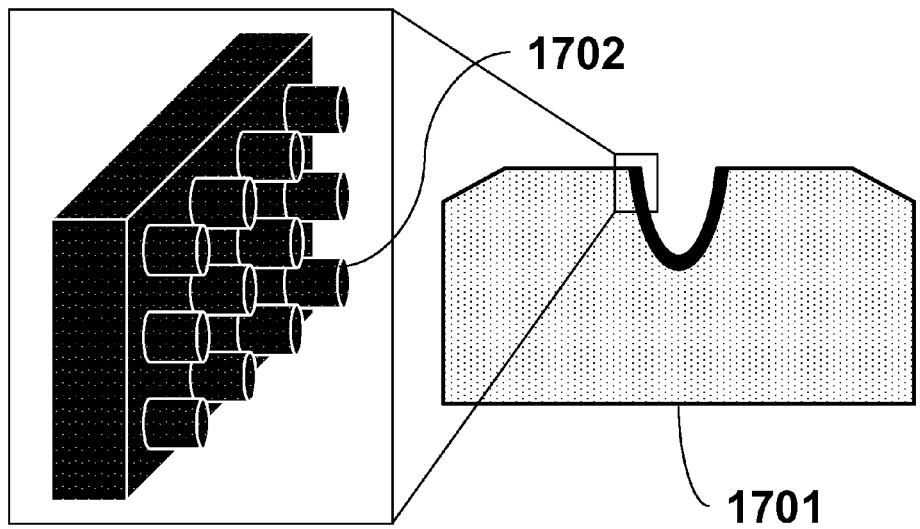
FIG. 17 shows an assembled microstructured prototype.
Figure 18:
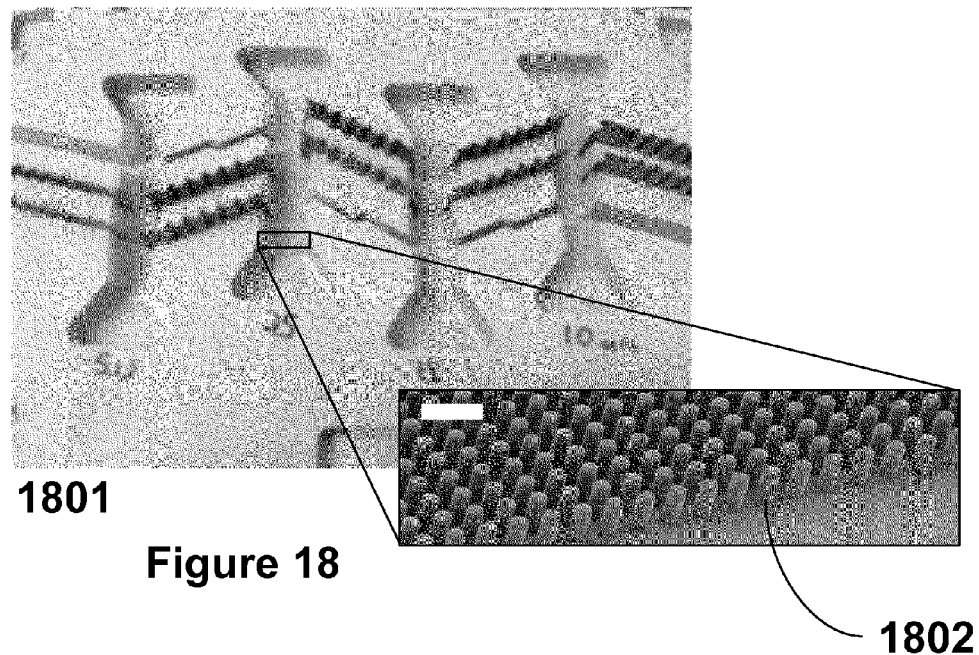
FIG. 18 shows an image of a microstructured prototype with a magnified image of flexible polymer microfeatures.

As described above, multiple embodiments are contemplated for providing a microstructured prototype. In a specific embodiment, a microstructured flexible polymer is attached to the surface of a prototype. The microstructured flexible polymer can be patterned using methods including, but not limited to drilling; milling; ion milling; machining; electro discharge machining; electroplating; ink jet printing; electrohydrodynamic ink jet printing; plasma etching; chemical etching; lithographic patterning techniques such as photolithography, x-ray lithography, electron beam lithography, soft lithography; embossing; stamping; molding; forging; etching with a plasma, gas or liquid; probe microscopy; atomic force microscopy; nano-indentation microscopy; chemical vapor deposition; physical vapor deposition; evaporation; electrospinning; or weaving microfibers or strands onto or into the surface. FIG. 16 shows an embodiment where a microstructured polymer 1602 having a plurality of micro pillars is inserted into a groove of a prototype 1601. FIG. 17 shows the resulting microstructured prototype 1701. FIG. 18 shows an image of a prototype 1801 embodiment having a microstructured flexible polymer inserted into a groove. FIG. 18 also shows an expanded view image of a microstructured flexible polymer showing micro pillar type microfeatures 1802. The bar in the expanded image represents a distance of 100 µm.

Figure 19:
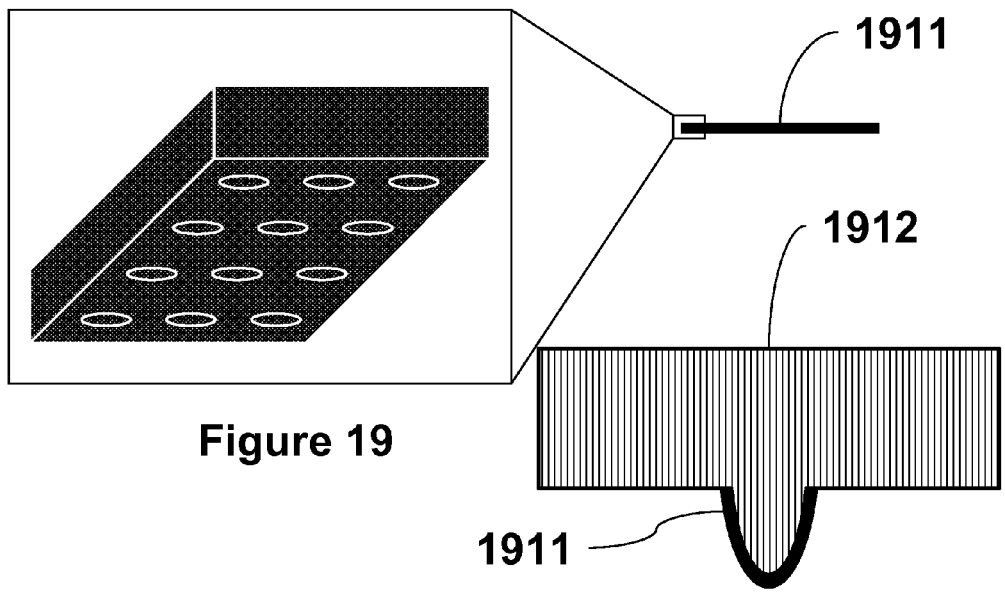
FIG. 19 shows a microstructured flexible polymer for attachment to a macro mold.
Figure 20:
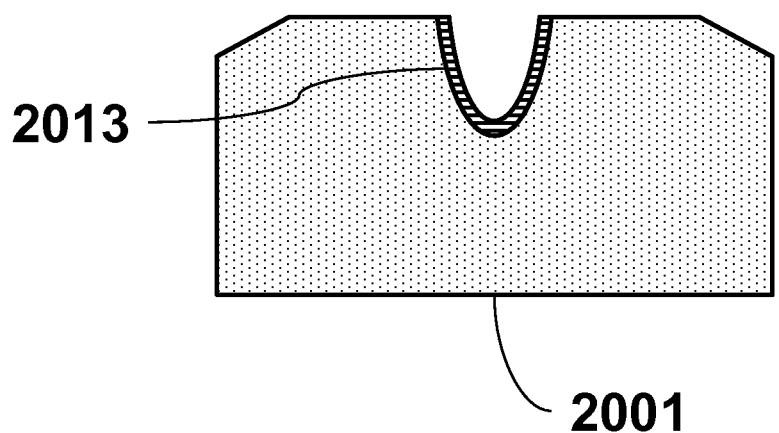
FIG. 20 shows an uncured polymer attached to a prototype.
Figure 21:
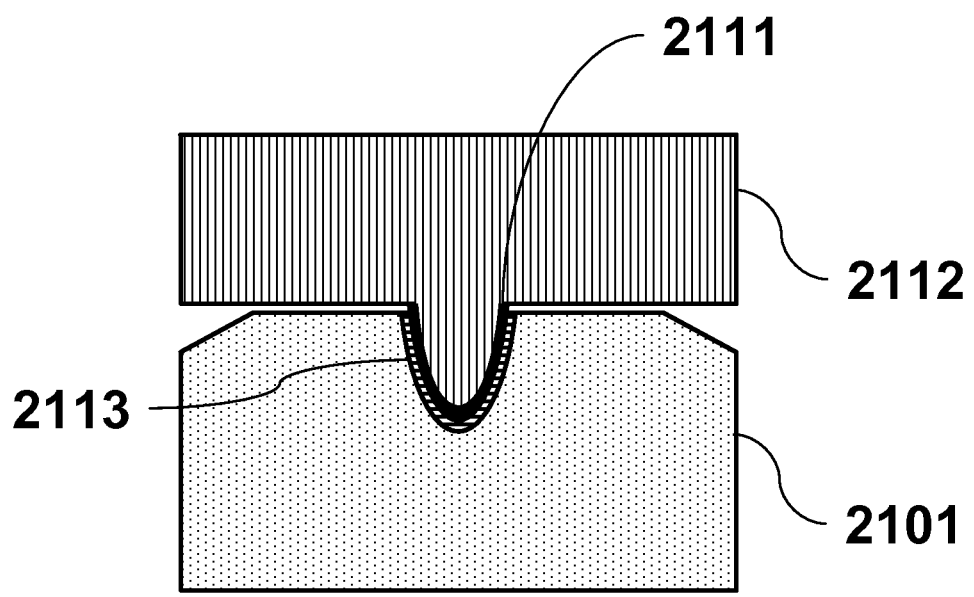
FIG. 21 shows a macro mold with an attached microstructured flexible polymer molding an uncured polymer attached to a prototype.
Figure 22:
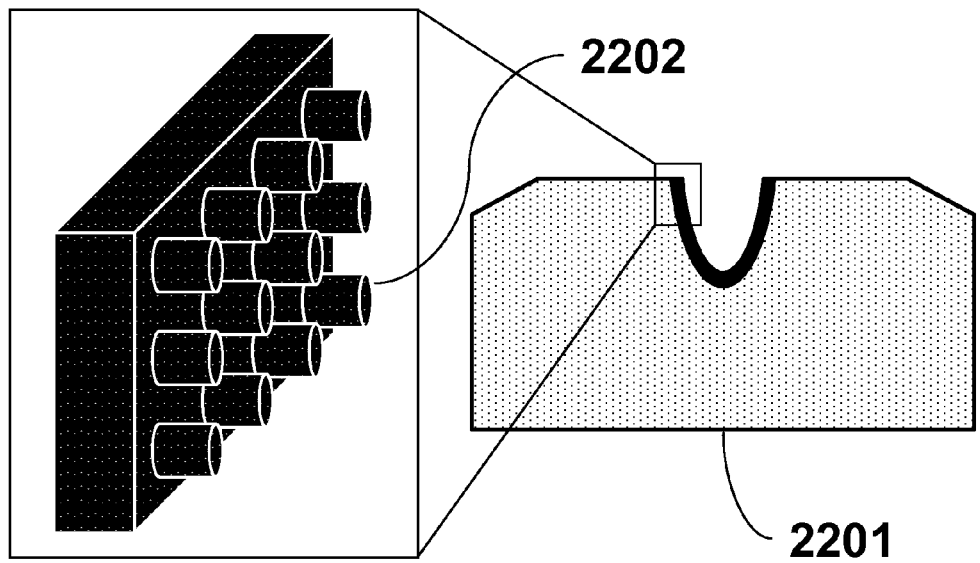
FIG. 22 shows a prototype with a cured microstructured polymer molded by a macro mold with an attached microstructured flexible polymer.
Figure 23:
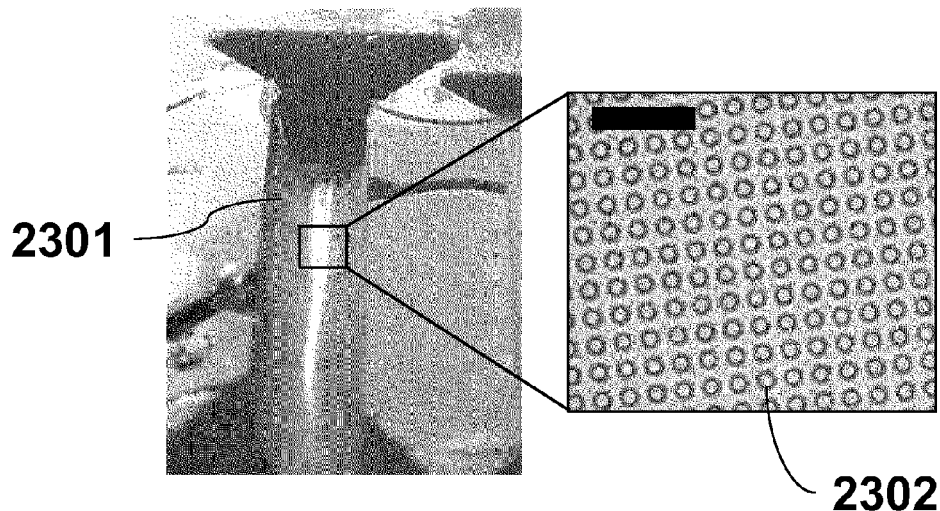
FIG. 23 shows an image of a directly molded microstructured prototype with a magnified image of cured polymer microfeatures.

In another embodiment, microstructures are molded directly onto the prototype. One method of achieving this comprises providing a microstructured flexible polymer 1911 as shown in FIG. 19 and attaching to the surface of a macro mold 1912. Next, an uncured polymer 2013 is placed into the desired position for microstructures on a prototype 2001, as shown in FIG. 20. As shown in FIG. 21, macro mold 2112 and microstructured polymer 2111 are brought into contact with prototype 2101 and uncured polymer 2113 where heat and pressure are applied to cure the uncured polymer. FIG. 22 depicts the resulting microstructured prototype 2201 having microfeatures 2202. FIG. 23 shows an image of a microstructured prototype having microfeatures directly molded onto the prototype 2301. FIG. 23 also shows an expanded view image of the microstructured prototype showing microfeatures 2302 replicated with high fidelity in the molding process. The bar in the expanded view image represents a distance of 150 µm.

The invention may be further understood by the following non-limiting examples.

Example 1

Microcasting Process Chain and Process Details

This example describes a method of casting microstructures into the curved surfaces of three different material classes: rubber, ceramic, and metal. FIG. 1 illustrates the micromolding casting process chain. The microcasting process chain begins with a prototype that has microstructures incorporated into its curved surface. Rubber is cast to the curved surface of the microstructured prototype, ceramic is cast to the curved surface of the microstructured rubber, metal is cast to the curved surface of the microstructured ceramic, and the microstructured metal molds or casts the curved surface of the end product. The microstructures replicate through all steps in the process chain. While this example describes the microstructured prototype with micropillars, this process is not limited to micropillars. The microstructured prototype could have microholes or other geometry types that would replicate through all steps in the process chain.

Two methods are described in this example for microstructuring the prototype: Insertion of microstructured polymer and direct molding of microstructures. FIGS. 16 and 17 explain the insertion route. The insertion route begins with flexible microstructured polymer 1611 and a prototype 1601 that has cm-scale grooves. Flexible microstructured polymer is inserted and adhered into the cm-scale grooves of the Prototype, resulting in a microstructured prototype 1701. FIG. 18 shows a picture of a microstructured prototype 1801 with microstructures 1802 inserted and adhered inside the cm-scale grooves. FIGS. 19, 20 and 21 explain the direct molding route. Flexible polymer 1911 with microholes adheres to a macro mold 1912 to create a microstructured mold. Uncured polymer 2013 is deposited in the cm-scale grooves of the prototype 2001, and the microstructured mold 2112 presses and heats the prototype 2101 and uncured polymer 2113, curing the deposited polymer. The Microstructured mold releases the prototype resulting in a microstructured prototype 2201. FIG. 23 shows a picture of a microstructured prototype 2301 with microstructures 2302 direct molded inside the cm-scale grooves of the prototype. The curved surface of the microstructured prototype has a conformal covering of microstructures in both the insertion and direct molding routes.

FIGS. 2, 3 and 4 explain the microstructured prototype-to-rubber casting step. If desired, a release agent is sprayed onto the microstructured prototype mold 201 to ease demolding rubber from the microstructured prototype. One release agent that has been used is by Ciba Specialty Chemicals and is composed of napfin, paraffin wax, polysiloxanes, synthetic waxes, and mineral oil. When rubber 303 is cast from the microstructured prototype 201/301, the microstructures 202 from the microstructured prototype 201/301 replicate into the microstructured rubber. A vacuum of 22 in Hg assisted the casting of rubber 303 into the microstructured prototype 201/301. In this example, microholes 404 are cast into the microstructured rubber 403 from micropillars 202 in the microstructured prototype 201/301. FIG. 5 shows a picture of microstructures 504 replicated in rubber. A comparison of the microholes in the microstructured rubber to the micropillars of the microstructured prototype shows that the microstructured rubber was cast from the microstructured prototype with high fidelity.

FIGS. 4, 6 and 7 explain the microstructured Rubber-to-Ceramic casting step. One ceramic that has been used was Rantyre Investment from Ransom and Randolph which is a water based plaster. Any plaster similar to dental plaster is also suitable. If desired, a debonding agent is sprayed onto the microstructured rubber mold 403 to help the ceramic demold from the microstructured rubber mold. One debonding agent that has been used is simple soap in water. When the ceramic 605 is cast from microstructured rubber 403/603, the microstructured rubber surface replicates into the ceramic 605. The ceramic was vibrated at atmospheric pressure for approximately 30 seconds to remove gas bubbles from the ceramic before it hardened. In this example, micropillars 706 are cast into the microstructured ceramic 705 by the microholes 404 from the microstructured rubber 403/603. FIG. 8 shows a picture of microstructures 806 replicated in ceramic. A comparison of the micropillars in the microstructured ceramic to the microholes of the microstructured rubber shows that the microstructured ceramic cast to the microstructured rubber with high fidelity. The microstructured ceramic was then cured, for example at 150° C. for 12 hours, before casting metal to it.

FIGS. 7, 9 and 10 explain the microstructured ceramic-to-metal casting step. When the metal 907 is cast to microstructured ceramic 905, the microstructured ceramic surface replicates into the metal. In this example, metal microholes 1008 are cast from micropillars 706 in the microstructured ceramic 705/905. FIG. 11 shows a picture of microstructures 1108 replicated in metal. A comparison of the microholes in the microstructured metal to the micropillars of the Microstructured Ceramic shows that the microstructured metal cast to the microstructured ceramic with high fidelity.

FIGS. 12 and 13 explain the microstructured metal-to-end product casting or molding step. When the microstructured metal 1207 casts or molds the end product 1209, the microstructured metal surface replicates into the end product. In this example, microholes 1008 from the microstructured metal 1007/1207 molded micropillars 1310 into the microstructured end product 1309. FIG. 14 shows a picture of microstructured end product, reduced to practice. While molding created this specific end product, casting methods can also be used.

FIG. 15 shows a variety of shapes that have been micromolded into the end product. 10-50 μm wide circles, ellipses, triangles, and squares have been micromolded into the end product with heights ranging from 35-70 μm. Microstructures with an aspect ratio of 7:1 (height:width) have been molded into the end product. The circles and ellipses show that this process can be used to produce round microstructures in the end product. The triangles and squares show that this process can be used to produce sharp-cornered straight-edged microstructures in the end product.

Example 2

Fabrication Method for Tailored Micrometer-Scale and Nanometer-Scale Structures

Figure 24:
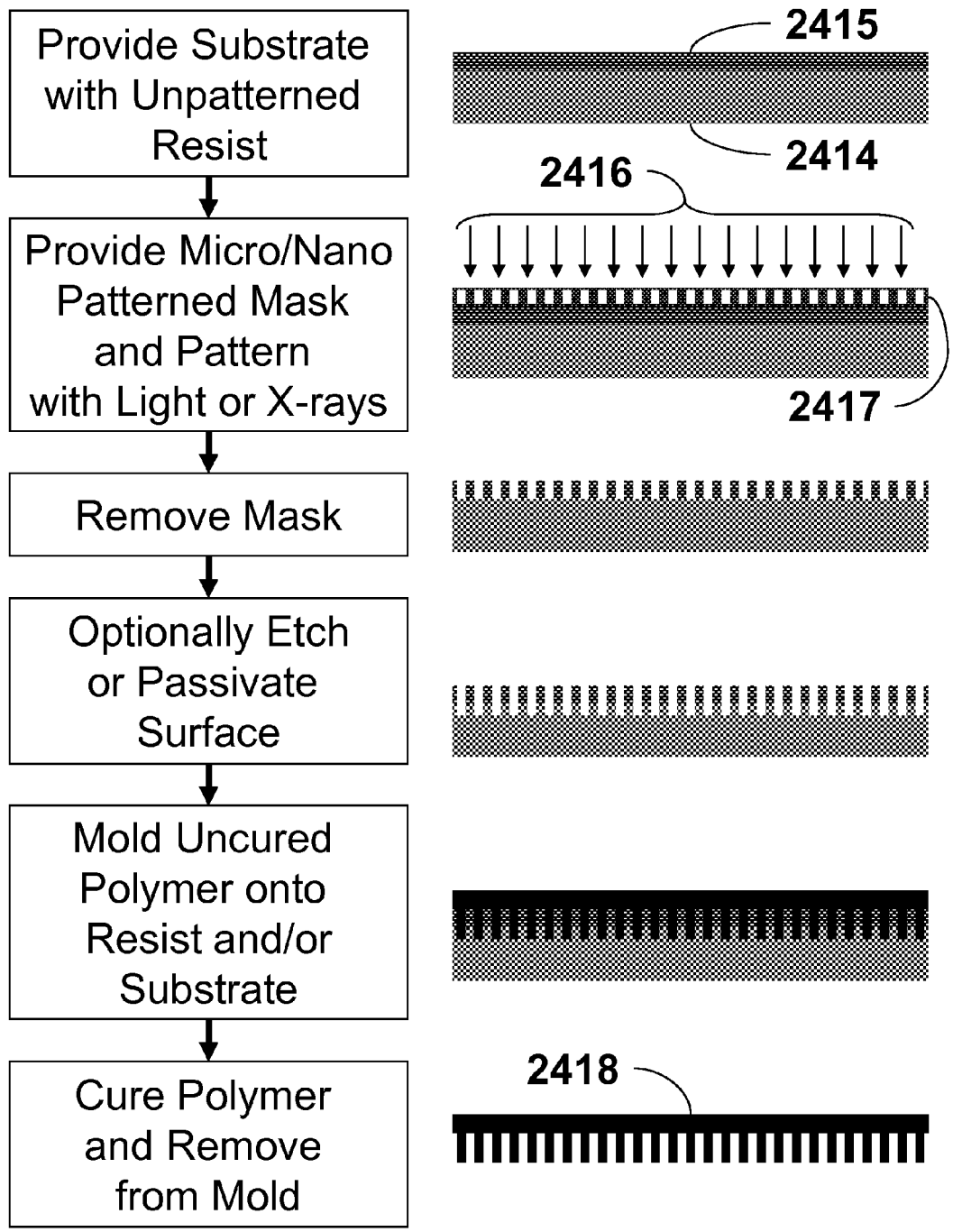
FIG. 24 provides an overview of a method of patterning a flexible polymer.

FIG. 24 shows a technique for fabricating Lithographically Defined Arrays of Micro/Nanostructures (LDAMN). The technique begins with a substrate 2414 topped with a photosensitive polymer or resist 2415 sensitive to light or particles. By shining light 2416 through a stencil mask 2417 onto the resist, micrometer-scale or nanometer-scale structures can be formed in the resist. Other kinds of electromagnetic waves, energy beams, or particles can also be used to form these microstructures or nanostructures. The structures can be arrayed into patterns or not, but their key characteristic is that the manufacturing process controls their size, shape, and position with micrometer-scale or nanometer-scale accuracy and precision.

The resist having tailored microstructures or nanostructures can be used as a mold at this stage. The substrate can also be treated (for example with a chemical etch) to modify the microstructures. Furthermore, the surface can be coated with an agent to ease or improve subsequent molding steps.

Uncured polymer can be molded into the microstructures and cured by heat, time, UV light or other curing methods. When the cured polymer 2418 is removed from the substrate-resist mold, the structures from the mold are transferred into the polymer, and are also mechanically flexible.

Figure 25:
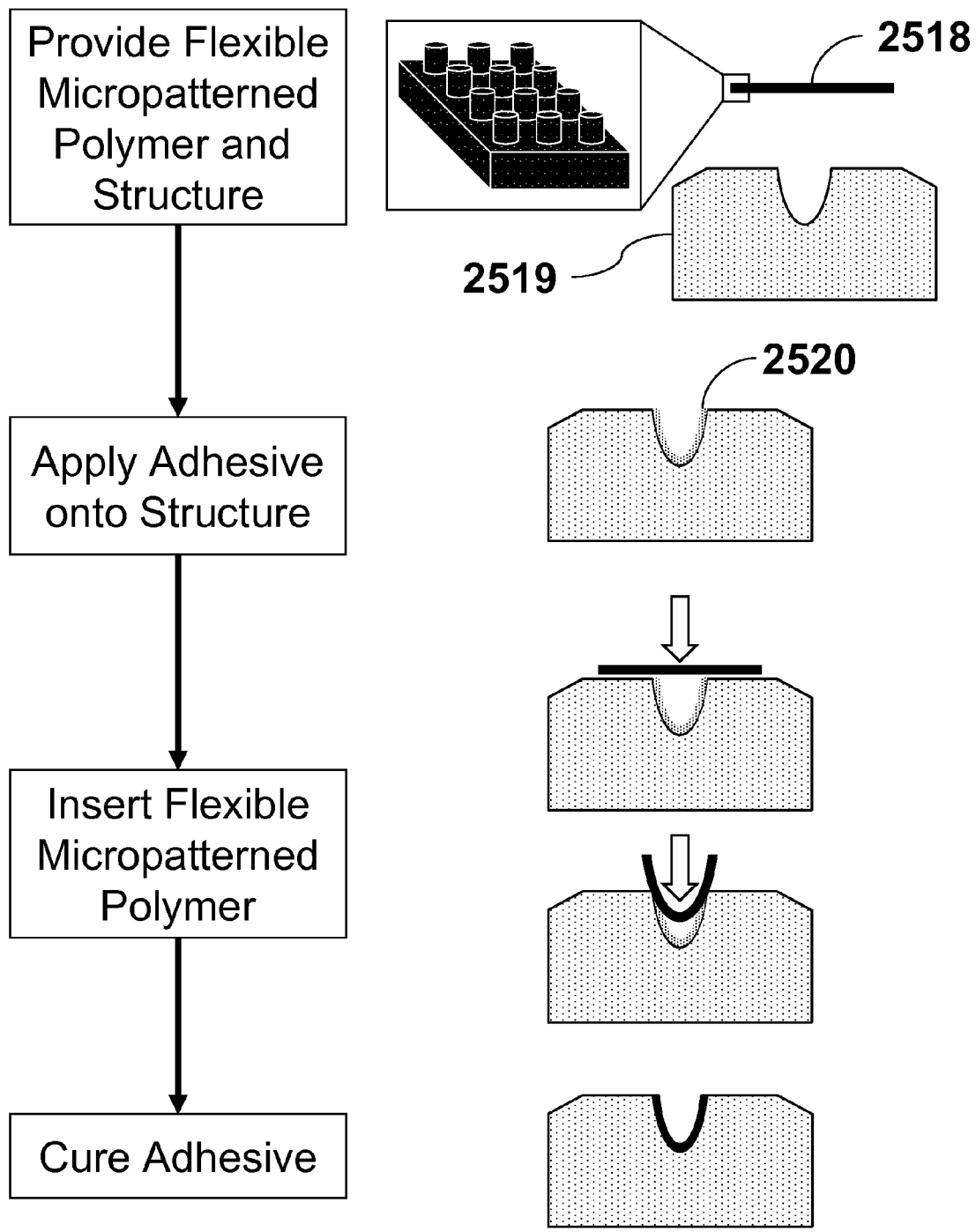
FIG. 25 shows details of attachment of a microstructured flexible polymer to a structure.

FIG. 25 shows the process of integrating the polymer having tailored microstructure or nanostructures into millimeter-scale or centimeter-scale grooves. The process begins with the flexible polymer sheet 2518 having the microstructures and a structure 2519 suitable for receiving the flexible polymer sheet. Adhesive 2520 is applied to the cm-scale grooves of the receiving structure, and the flexible polymer sheet is inserted into the cm-scale grooves. Once the adhesive cures, the flexible polymer sheet is securely bonded to the structure. The combined structure is now suitable for subsequent molding and/or casting steps.

Example 3

Reusability of Microstructured Objects and Heterogeneity of Microfeatures

A microstructured prototype having a preselected pattern of microfeatures was fabricated. The preselected pattern included two regions of different microfeature shapes. The first region included micropillars 100 μm tall with 100 μm wide triangular cross-sectional shapes. The second region included micropillars 100 μm tall with 100 μm wide circular cross-sectional shapes.

A rubber was cast to the microstructured prototype to create a first microstructured rubber object. The microstructured rubber object thus produced included the two regions of different microfeature shapes formed from the casting of those of the microstructured prototype. The first region formed microholes 100 μm deep with 100 μm wide triangular cross-sectional shapes in the microstructured rubber. The second region formed microholes 100 μm deep with 100 μm wide circular cross-sectional shapes in the microstructured rubber.

Once the first microstructured rubber was removed from the microstructured prototype, rubber was again cast to the microstructured prototype to create a second microstructured rubber object having microfeatures matching those of the first microstructured rubber object.

A ceramic was cast to the second microstructured rubber object to create a first microstructured ceramic object. The microstructured ceramic object thus produced included the two regions of different microfeature shapes formed from the casting of those of the microstructured rubber. The first region formed micropillars 100 μm tall with 100 μm wide triangular cross-sectional shapes in the microstructured ceramic. The second region formed micropillars 100 μm tall with 100 μm wide circular cross-sectional shapes in the microstructured ceramic.

Once the first microstructured ceramic was removed from the second microstructured rubber object, ceramic was again cast to the second microstructured rubber object to create a second microstructured ceramic object having microfeatures matching those of the first microstructured ceramic object.

Figure 26:
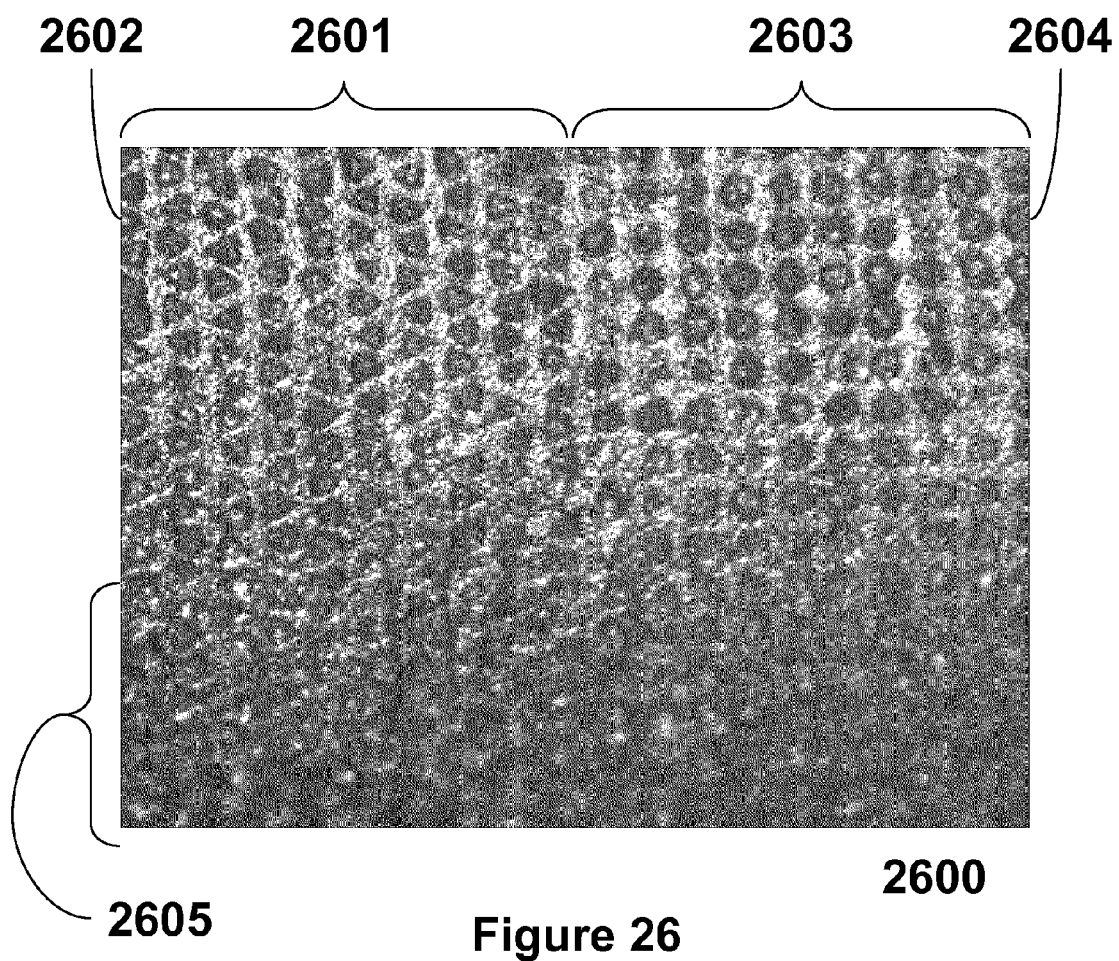
FIG. 26 provides an image of a microstructured aluminum object.

Finally, aluminum was cast to the second microstructured ceramic object to create a microstructured aluminum object 2600. The microstructured aluminum object thus produced included the two regions of different microfeature shapes formed from the casting of those of the second microstructured ceramic object. A photograph of the microstructured aluminum object 2600 is shown in FIG. 26. The first region 2601 formed microholes 2602 100 μm deep with 100 μm wide triangular cross-sectional shapes in the microstructured rubber. The second region 2603 formed microholes 2604 100 µm deep with 100 µm wide circular cross-sectional shapes in the microstructured rubber.

The microstructured prototype included curved regions which were transferred during the multiple casting steps to the microstructured aluminum. In FIG. 26, this curvature can be observed near the bottom portion 2605 of the photograph, where the photograph becomes out of focus due to the shallow depth of field of the camera.

REFERENCES

U.S. Patent Application Publication No. US 2006/0162896.
U.S. Pat. No. 5,735,985.
U.S. Pat. No. 6,502,622.
U.S. Pat. No. 7,237,337.
U.S. Pat. No. 6,511,622.
U.S. Pat. No. 7,410,606.
Schmitz, Grohn and Buhrig-Polaczek, Advanced Engineering Materials 2007, 9, No. 4, pp. 265-270.
Baumeister, Okolo and Rogner, Microsyst. Technol. (2008) 14: 1647-1655.
Baumeister, Ruprecht and Hausselt, Microsyst. Technol. (2004) 10: 261-264.
Rath, Baumeister and Hausselt, Microsyst. Technol. (2006) 12: 258-266.
Baumeister, Rath and Hausselt, Microsyst. Technol. (2006) 12: 773-777.
Baumeister, Okolo, Rogner, Ruprecht, Kerscher, Schulze Haußelt and Lohe, Microsyst. Technol. (2008) 14: 1813-1821.
Baumeister, Ruprecht and Hausselt, Microsyst. Technol. (2004) 10: 484-488.
Baumeister, Mueller, Ruprecht and Hausselt, Microsyst. Technol. (2002) 8: 105-108.
Barbieri, Wagner and Hoffman, Langmuir (2007) 23: 1723-1734.
Hua, Sun, Gaur, Meitl, Bilhaut, Rotkina, Wang, Geil, Shim, Rogers and Shim, Nano Lett. (2004) 4: 2467-2471.
Auger, Schilardi, Caretti, Sanchez, Benitez, Albella, Gago, Fonticelli, Vasquez, Salvarezza and Azzaroni, Small (2005) 1: 300-309.
Wang, Liang, Liang and Chou, Nano Lett. (2008) 8: 1986-1990.
Bico, Thiele, Quere, Colloids and Surfaces A (2002), 206: 41-46.
Lee, Yoon and Kim, J. Phys. Chem. Solids (2008), 69: 2131-2136.
Kumar, Tang and Schroers, Nature (2009), 457: 868-872.
Guo, Advanced Materials (2007), 19: 495-513.

STATEMENTS REGARDING INCORPORATION BY REFERENCE AND VARIATIONS

All references throughout this application, for example patent documents including issued or granted patents or equivalents, patent application publications, and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

U.S. provisional patent application entitled "Methods for Fabricating Microstructures," filed Feb. 17, 2009 and having inventors William P. King and Andrew H. Cannon and Ser. No. 61/153,028, is herein incorporated by reference in its entirety to the extent not inconsistent with the present description.

All patents and publications mentioned in the specification are indicative of the levels of skill of those skilled in the art to which the invention pertains. References cited herein are incorporated by reference herein in their entirety to indicate the state of the art, in some cases as of their filing date, and it is intended that this information can be employed herein, if needed, to exclude (for example, to disclaim) specific embodiments that are in the prior art. For example, when a compound is claimed, it should be understood that compounds known in the prior art, including certain compounds disclosed in the references disclosed herein (particularly in referenced patent documents), are not intended to be included in the claim.

When a group of substituents is disclosed herein, it is understood that all individual members of those groups and all subgroups and classes that can be formed using the substituents are disclosed separately. When a Markush group or other grouping is used herein, all individual members of the group and all combinations and subcombinations possible of the group are intended to be individually included in the disclosure.

Every formulation or combination of components described or exemplified can be used to practice the invention, unless otherwise stated. Specific names of materials are intended to be exemplary, as it is known that one of ordinary skill in the art can name the same material differently. One of ordinary skill in the art will appreciate that methods, device elements, starting materials, and synthetic methods other than those specifically exemplified can be employed in the practice of the invention without resort to undue experimentation. All art-known functional equivalents, of any such methods, device elements, starting materials, and synthetic methods are intended to be included in this invention. Whenever a range is given in the specification, for example, a temperature range, a time range, or a composition range, all intermediate ranges and subranges, as well as all individual values included in the ranges given are intended to be included in the disclosure.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially" of does not exclude materials or steps that do not materially affect the basic and novel characteristics of the claim. Any recitation herein of the term "comprising", particularly in a description of components of a composition or in a description of elements of a device, is understood to encompass those compositions and methods consisting essentially of and consisting of the recited components or elements. The invention illustratively described herein suitably may be practiced in the absence of any element or elements, limitation or limitations which is not specifically disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

We claim:

1. A method of making a microstructured object, the method comprising the steps of:
   providing a semiconductor wafer;
   patterning the semiconductor wafer with a preselected pattern of microfeatures;
   molding an uncured first polymer to the patterned semiconductor wafer;
   curing the first polymer, thereby forming a microstructured flexible polymer having the preselected pattern of microfeatures on a surface of the microstructured flexible polymer;
   removing the microstructured flexible polymer from the patterned semiconductor wafer;
   providing a macro mold having one or more macro scale features, wherein the macro scale feature of the macro mold is one of a recessed feature and a relief feature;
   deforming at least a portion of the microstructured flexible polymer so as to conform the microstructured flexible polymer to at least a portion of the surface of the one or more macro scale features of the macro mold wherein the microstructured flexible polymer is placed so that a surface of the microstructured flexible polymer opposite to the surface having the preselected pattern of microfeatures faces the portion of the surface of the one or more macro scale features of the macro mold;
   providing a large-area prototype having one or more macro scale features, wherein the macro scale feature of the large-area prototype is the other of a recessed feature and a relief feature;
   depositing an uncured second polymer onto at least a portion of a surface of the one or more macro scale features of the prototype;
   molding the uncured second polymer by bringing the macro mold and microstructured flexible polymer into contact with the prototype and the uncured second polymer;
   curing the uncured second polymer, thereby making a microstructured second polymer having the preselected pattern of microfeatures;
   releasing the macro mold and microstructured flexible polymer from the prototype and microstructured second polymer; and
   casting or molding a material to the prototype and microstructured second polymer, thereby replicating the preselected pattern of microfeatures in at least a portion of a cast or molded object.

2. The method of claim 1, wherein at least a portion of the pattern of microfeatures of the microstructured flexible polymer is positioned on a curved surface of the macro mold and at least a portion of the pattern of microfeatures of the cast or molded object are positioned on a curved surface of the cast or molded object.

3. The method of claim 1 wherein in the deforming step at least a portion of the microstructured flexible polymer is deformed to radius of curvature selected over the range of 100 µm to 3 m, wherein at least a portion of the microstructured flexible polymer is deformed to a strain level selected over the range of 1% to 1300% or wherein at least a portion of the microstructured flexible polymer is deformed to radius of curvature selected over the range of 100 µm to 3 m and to a strain level selected over the range of 1% to 1300%.

4. The method of claim 1 wherein the microfeatures have dimensions selected over the range of 10 nm to 100 µm and a pitch of the microfeatures is selected over the range of 10 nm to 100 µm.

5. The method of claim 4, wherein at least a portion of microfeatures have an aspect ratio of height or depth to width of 1:2 to 7:1.

6. The method of claim 1 wherein 80% to 100% of at least a portion of the surface of the macro scale features is covered by the preselected pattern of microfeatures.

7. The method of claim 1 wherein the preselected pattern of microfeatures is replicated in each casting and/or molding step with a replication fidelity selected over the range of 50% to 100%.

8. The method of claim 1, wherein the material of the cast or molded object is tire rubber, thereby making a microstructured tire.

* * * * *